United States Patent
Lee

(10) Patent No.: US 6,834,440 B2
(45) Date of Patent: Dec. 28, 2004

(54) WAFER SPIN DRYING APPARATUS WITH A PLURALITY OF SUPPLY NOZZLES AND METHODS FOR USING THE SAME

(75) Inventor: Keum-Joo Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/436,807

(22) Filed: May 13, 2003

(65) Prior Publication Data

US 2004/0060190 A1 Apr. 1, 2004

(30) Foreign Application Priority Data

Sep. 30, 2002 (KR) .............................. 10-2002-0059555

(51) Int. Cl.[7] .............................................. F26B 11/00
(52) U.S. Cl. .............................. 34/58; 34/59; 34/187; 34/241; 34/582; 34/523; 34/222
(58) Field of Search .......................... 34/58, 59, 187, 34/241, 72, 312, 314, 324, 351, 492, 582, 639, 523, 222, 652, 653, 654, 655, 656

(56) References Cited

U.S. PATENT DOCUMENTS

| | | | | |
|---|---|---|---|---|
| 4,989,345 A | * | 2/1991 | Gill, Jr. ........................ | 34/58 |
| 5,416,047 A | * | 5/1995 | Konishi et al. .......... | 430/271.1 |
| 5,772,764 A | * | 6/1998 | Akimoto ...................... | 118/319 |
| 5,829,156 A | | 11/1998 | Shibasaki et al. .............. | 34/58 |
| 5,853,484 A | * | 12/1998 | Jeong .......................... | 118/715 |
| 6,027,574 A | | 2/2000 | Fishkin et al. ................ | 134/30 |
| 6,029,371 A | | 2/2000 | Kamikawa et al. ........... | 34/516 |
| 6,394,110 B2 | * | 5/2002 | Kamikawa et al. .......... | 134/61 |
| 6,401,353 B2 | * | 6/2002 | Kimura ........................ | 34/72 |
| 6,401,361 B1 | * | 6/2002 | Chen et al. ................... | 34/467 |
| 6,616,772 B2 | * | 9/2003 | de Larios et al. ............. | 134/21 |
| 6,647,642 B2 | * | 11/2003 | Kamikawa et al. .......... | 34/490 |
| 6,655,042 B2 | * | 12/2003 | Yi et al. ...................... | 34/340 |
| 2004/0040177 A1 | * | 3/2004 | Izumi .......................... | 34/492 |

* cited by examiner

Primary Examiner—Kenneth Rinehart
(74) Attorney, Agent, or Firm—Myers Bigel Sibley & Sajovec

(57) ABSTRACT

An apparatus for drying a wafer includes a rotating chuck configured to rotate the wafer. A movable de-ionized water supply member and an organic solvent supply member are positioned adjacent a face of the wafer. The de-ionized water supply member supplies de-ionized water onto the wafer, and the organic solvent supply member has a plurality of solvent supply nozzles disposed to supply an organic solvent onto the wafer. The organic solvent supply member includes a first solvent supply member and a second solvent supply member. The de-ionized water supply member and the first solvent supply member move radially between a position adjacent the central portion of the wafer and the edge portion of the wafer.

22 Claims, 19 Drawing Sheets

WAFER SPIN DRYING APPARATUS WITH A PLURALITY OF SUPPLY NOZZLES AND METHODS FOR USING THE SAME

RELATED APPLICATION

This application claims priority to Korean Patent Application 2002-0059555, filed on Sep. 30, 2002, the contents of which are herein incorporated by reference in their entirety.

BACKGROUND OF THE INVENTION

The present invention relates to apparatus for drying wafers, and more particularly, to spin type drying apparatus and methods for using the same.

The integration density, speed and reliability for integrated circuit (semiconductor) devices continues to increase to meet the demands for higher performance products incorporating such integrated circuit devices. As the performance requirements of the integrated circuit devices increase, the demands on manufacturing processes to provide a desirable yield when fabricating such devices may also increase.

The manufacture of semiconductor devices generally includes repeated execution of various individual processing steps, such as a deposition process, a photolithography process, an etching process, a polishing process, a cleaning process, a drying process and so on. The various processes may be repeated in a desired sequence with specified materials to provide a layered structure with the desired characteristics as will be understood by those of skill in the art. In particular, the cleaning process is typically used to remove impurities attached to the surface of a wafer or undesired films formed on the wafer during the other processing operations. The importance of the cleaning process generally increases with higher density and more complicated fabrication patterns for the integrated circuit devices and as the aspect ratios of the patterns increase. The drying process is intended to remove moisture remaining on the wafer from the surface of the wafer after cleaning. However, watermarks may be left on the surface of the wafer after the cleaning and drying process. Such watermarks may cause processing failures during subsequent manufacturing process steps.

Wafer drying apparatus may be divided into batch type wafer drying apparatus and a single type rapid wafer drying apparatus, such as spin type drying apparatus. The batch type wafer drying apparatus can be further divided into a single container type apparatus and a dual container type apparatus. The single container type apparatus generally includes one container in which a wafer is rinsed and dried. Various single container type apparatus dry the wafer by employing, for example, the Marangoni effect or a spray of isopropyl alcohol. In contrast, a dual container type wafer drying apparatus generally has two containers, one for rinsing the wafer and the other for drying the wafer. Typically, for the dual container type wafer drying apparatus, the final rinsing process for the wafer is executed in a lower container and the drying process is performed in an upper container after the wafer is lifted into the upper container from the lower container. The dual container type wafer drying apparatus can dry the wafer using, for example, the Marangoni effect, spray of a liquid isopropyl alcohol, or using vapor of an isopropyl alcohol.

Examples of a batch type wafer drying apparatus are described in U.S. Pat. No. 6,027,574 to Fishkin et al. and U.S. Pat. No. 6,029,371 to Kamikawa et al. Fishkin et al. describes a batch type wafer drying apparatus of the single container type that employs the Marangoni effect. Kamikawa et al. discloses a batch type wafer drying apparatus that uses an isopropyl alcohol vapor.

A single type rapid wafer drying apparatus can dry a wafer using the centrifugal force produced during rotation of the wafer at a high speed, such as with a spin type drying apparatus. While the wafer is being rotated, an organic solvent, such as isopropyl alcohol, can be delivered onto a surface of the wafer to improve the efficiency of the wafer drying process.

An example of a single type rapid wafer drying apparatus is disclosed in U.S. Pat. No. 5,289,156 to Shibasaki et al. Shibasaki et al. describes a rotary (or spin type) wafer drying apparatus including a holder horizontally gripping a wafer and defining a back space positioned under the rear face of the wafer. A driving part rotates the wafer and a gas supply member provides a clean gas to the back space.

A spin type rapid wafer drying apparatus generally dries the wafer utilizing the centrifugal force generated by the rotation of the wafer. The apparatus may provide isopropyl alcohol to the wafer in order to increase the effectiveness of the removal of moisture from the wafer. The isopropyl alcohol can be delivered to the wafer, for example, in a vapor phase and/or in a mist state with a carrier gas.

FIG. 1 is a cross-sectional view illustrating a conventional single type rapid (spin type) wafer drying apparatus. As shown in FIG. 1, a wafer W is horizontally supported on rotating chuck 110. The wafer is held on the rotating chuck 110 by a vacuum provided through the rotating chuck 110. A rotary shaft 112 connects a driving part (e.g., motor) 114 to a bottom portion of the rotating chuck 110 to spin the rotating chuck 110 during the cleaning/drying operations. A cover 116 is disposed around the rotating chuck 110 to control the escape of de-ionized water dispersed from the wafer W during the cleaning operation. As shown in FIG. 1, the cover 116 has a cup shape with an open upper face and the rotary shaft 112 passes through the bottom portion of the cover 116. The rotary shaft 112 defines the central axis of rotation of the rotary chuck 110.

A de-ionized water supply member 120 is also shown in FIG. 1 disposed over the wafer W. In addition, an isopropyl alcohol supply member 130 is disposed over the wafer W. The de-ionized water supply member 120 moves from the central portion of the wafer W to the edge portion of the wafer W while supplying the de-ionized water onto the wafer W. The isopropyl alcohol supply member 130, like the de-ionized water supply member, also moves from the central portion to the edge portion of the wafer W during cleaning and supplies an isopropyl alcohol onto the wafer W. The isopropyl alcohol is provided to reduce the surface tension of the de-ionized water on the wafer W so that the wafer W may be more efficiently dried due to the centrifugal force generated by rotation of the wafer W.

Various problems may result when using the above-described apparatus 100. For example, watermarks may occur at the edge portion of the wafer W as the de-ionized water supply member 120 scanning the surface of the wafer W may not supply sufficient de-ionized water onto the edge portion of the wafer W. When the de-ionized water supply member 120 is positioned over the central portion of the wafer W, the moisture at the edge portion of the wafer W may not be properly removed from the wafer W and may, instead, be naturally dried (as contrasted with removed by centrifugal force) at the edge portion of the wafer W. Watermarks generally result when there is naturally dried moisture at the edge portion of the wafer W.

In addition, the de-ionized water dispersed from the wafer W due to centrifugal force may strike and rebound from the cover 116. As a result, this de-ionized water may fall back onto an already dried portion of the wafer W, generally the central portion. This re-deposited de-ionized water may also not be properly removed and may form additional watermarks on the wafer W. If the spin speed of the wafer W and the scanning speeds of the de-ionized water and the isopropyl alcohol supply members 120 and 130 are reduced to improve the efficiency of the drying process, the time required to dry the wafer W would be expected to increase.

The problems described above generally increase in seriousness as the size of the wafer W increases. However, as a result of potential benefits of working with larger wafer sizes, various manufacturing processes are tending to use larger wafer sizes, thereby increasing the potential benefits of improved wafer drying.

SUMMARY OF THE INVENTION

In some embodiments of the present invention, an apparatus for drying a wafer includes a rotating chuck configured to rotate the wafer. An organic solvent supply member is positioned adjacent a face of the wafer. The organic solvent supply member has a plurality of solvent supply nozzles disposed to supply an organic solvent(s) onto the wafer.

In particular embodiments of the present invention, the apparatus further includes a movable de-ionized water supply member positioned adjacent the face of the wafer. The de-ionized water supply member is configured to supply de-ionized water onto the wafer and to move radially between a position adjacent a central portion of the wafer and an edge portion of the wafer. The organic solvent supply member includes a first solvent supply member including at least one of the solvent supply nozzles positioned adjacent the wafer so as to move radially between a position adjacent the central portion of the wafer and the edge portion of the wafer. A second organic solvent supply member, including at least one of the solvent supply nozzles, is positioned in a fixed location adjacent the central portion. The de-ionized water supply member and the first organic solvent supply member may be configured to move together.

The solvent may be an alcohol. The solvent may include a vapor phase and at least one of the first and second solvent supply members may be configured to supply a vapor phase solvent. The solvent may include a mist phase solvent carried by a carrier gas and at least one of the first and second solvent supply members may be configured to supply the mist phase solvent carried by a carrier gas.

In other embodiments of the present invention, the apparatus includes a drying gas supply member positioned adjacent the wafer that is configured to supply a drying gas to the wafer. The de-ionized water supply member may be a longitudinally extending member extending radially from the central portion that includes a plurality of de-ionized water supply nozzles. The de-ionized water supply member may extend over the edge portion of the wafer when the de-ionized water supply member is in the position adjacent the central portion of the wafer.

In further embodiments of the present invention, the first solvent supply member is an arcuate shaped member including a plurality of nozzles. The arcuate shaped portion is concave with reference to a central axis of the rotary chuck. The de-ionized water supply member may also be an arcuate shaped member including a plurality of nozzles, the arcuate shaped portion being concave with reference to a central axis of the rotary chuck. The first organic solvent supply member may be positioned between the de-ionized water supply member and the central axis of the rotary chuck.

In other embodiments of the present invention, the de-ionized water supply member includes a first arcuate member and a second arcuate member, each including a plurality of nozzles, the second arcuate member being positioned on an opposite side of the central axis of the rotary chuck from the first arcuate member and being movable in an opposite direction from the first arcuate member. The first organic solvent supply member may include a third arcuate member and a fourth arcuate member, each including a plurality of nozzles, the fourth arcuate member being positioned on an opposite side of the central axis of the rotary chuck from the third arcuate member and being movable in an opposite direction from the third arcuate member. The first and second arcuate member may define a substantially circular member when the de-ionized water supply member is in the position adjacent the central portion of the wafer and the third and fourth arcuate member may define a substantially circular member when the first organic solvent supply member is in the position adjacent the central portion of the wafer.

In further embodiments of the present invention, the rotary chuck is configured to hold the wafer in a horizontal plane and the organic solvent supply member is a longitudinally extending member extending from a central portion of the wafer to an edge portion of the wafer. The plurality of nozzles are positioned therein in radially extending positions. The solvent supply member is positioned over the wafer. The organic solvent supply member may have a length of about half a diameter of the wafer. Alternatively, the organic solvent supply member may have a length of about a diameter of the wafer. The organic solvent supply member may be a pipe shaped member having a receiving chamber configured to receive the organic solvent and the nozzles of the organic solvent supply member may be communicatively coupled to the receiving chamber.

In other embodiments of the present invention, the rotary chuck is configured to hold the wafer in a horizontal plane. The organic solvent supply member is a substantially disc shaped member extending over substantially the entire wafer. The plurality of nozzles is positioned therein to substantially uniformly supply the organic solvent to the wafer without movement of the organic solvent supply member. The organic solvent supply member may further include a receiving chamber configured to receive the organic solvent and the nozzles of the organic solvent supply member may be communicatively coupled to the receiving chamber.

In further embodiments of the present invention, methods are provided of spin drying a wafer using a drying apparatus having a plurality of organic solvent supply members. A first of the organic solvent supply members is provided that directs organic solvent towards the wafer and a de-ionized water supply member is provided that directs de-ionized water toward the wafer. The first of the organic solvent supply members and the de-ionized water supply member are movable radially across the wafer. A second of the organic solvent supply members is provided in a fixed position adjacent a central portion of the wafer that directs organic solvent toward the wafer. Organic solvent is provided to the first and second organic solvent supply members and de-ionized water is provided to the de-ionized water supply member while rotating the wafer and moving the first organic solvent supply member and the de-ionized water supply member radially across the wafer to dry the wafer.

Further embodiments of the present invention provide an apparatus for drying a wafer having a rotating chuck, a de-ionized water supply member for supplying de-ionized water onto the wafer, a first organic solvent supply member for supplying an organic solvent onto the wafer on which the de-ionized water is supplied, and a second organic solvent supply member for supplying an organic solvent onto a central portion of the wafer.

The rotating chuck horizontally grips the wafer and rotates the wafer. The de-ionized water supply member is disposed over the wafer rotated by the rotating chuck and the de-ionized water supply member moves from the central portion of the wafer to the edge portion of the wafer. The first organic solvent supply member moves along a moving passage of the de-ionized water supply member.

Other embodiments of the present invention provide an apparatus for drying a wafer that includes a rotating chuck, a de-ionized water supply member having a plurality of de-ionized water supply nozzles disposed along a central axis of the de-ionized water supply member for supplying de-ionized water onto the wafer, and an organic solvent supply member for supplying an organic solvent onto the wafer on which the de-ionized water is supplied.

The rotating chuck horizontally grips a wafer and rotates the wafer. The de-ionized water supply member is disposed over the wafer rotated by the rotating chuck. The de-ionized water supply member has a pipe shape prolonged from a central portion of the wafer to an edge portion of the wafer and the water supply member moves from the central portion of the wafer to the edge portion of the wafer. The organic solvent supply member moves along a moving passage of the de-ionized water supply member.

Further embodiments of the present invention provide an apparatus for drying a wafer that has a rotating chuck for horizontally gripping a wafer and for rotating the wafer, a de-ionized water supply member for supplying de-ionized water onto the wafer and an organic solvent supply member having a plurality of organic solvent supply nozzles for supplying an organic solvent onto the wafer on which the de-ionized water is supplied. The de-ionized water supply member is disposed over the wafer rotated by the rotating chuck and the water supply member moves from a central portion of the wafer to an edge portion of the wafer. The organic solvent supply member has a curved pipe shape and the organic solvent supply member is disposed over the wafer so that a first curved center of the organic solvent supply member faces a center of the wafer. The organic solvent supply member moves along a moving passage of the de-ionized water supply member.

Other embodiments of the present invention provide an apparatus for drying a wafer that includes a rotating chuck for horizontally gripping a wafer and for rotating the wafer and an organic solvent supply member having a plurality of organic solvent supply nozzles radially disposed over the wafer for supplying an organic solvent onto the wafer. The organic solvent supply member is disposed over the wafer rotated by the rotating chuck. The organic solvent can include an isopropyl alcohol, and may include the vapor of the isopropyl alcohol or the mist of the isopropyl alcohol.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "on" or "connected to" or "coupled to" another element, it can be directly on, connected to or coupled to the other element or intervening layers or elements may also be present. In contrast, when an element is referred to as being "directly on" or "directly connected to" or "directly coupled to" another element, there are no intervening layers or elements present. The relative thickness of layers in the illustrations may be exaggerated for purposes of describing the present invention.

Figure 1:
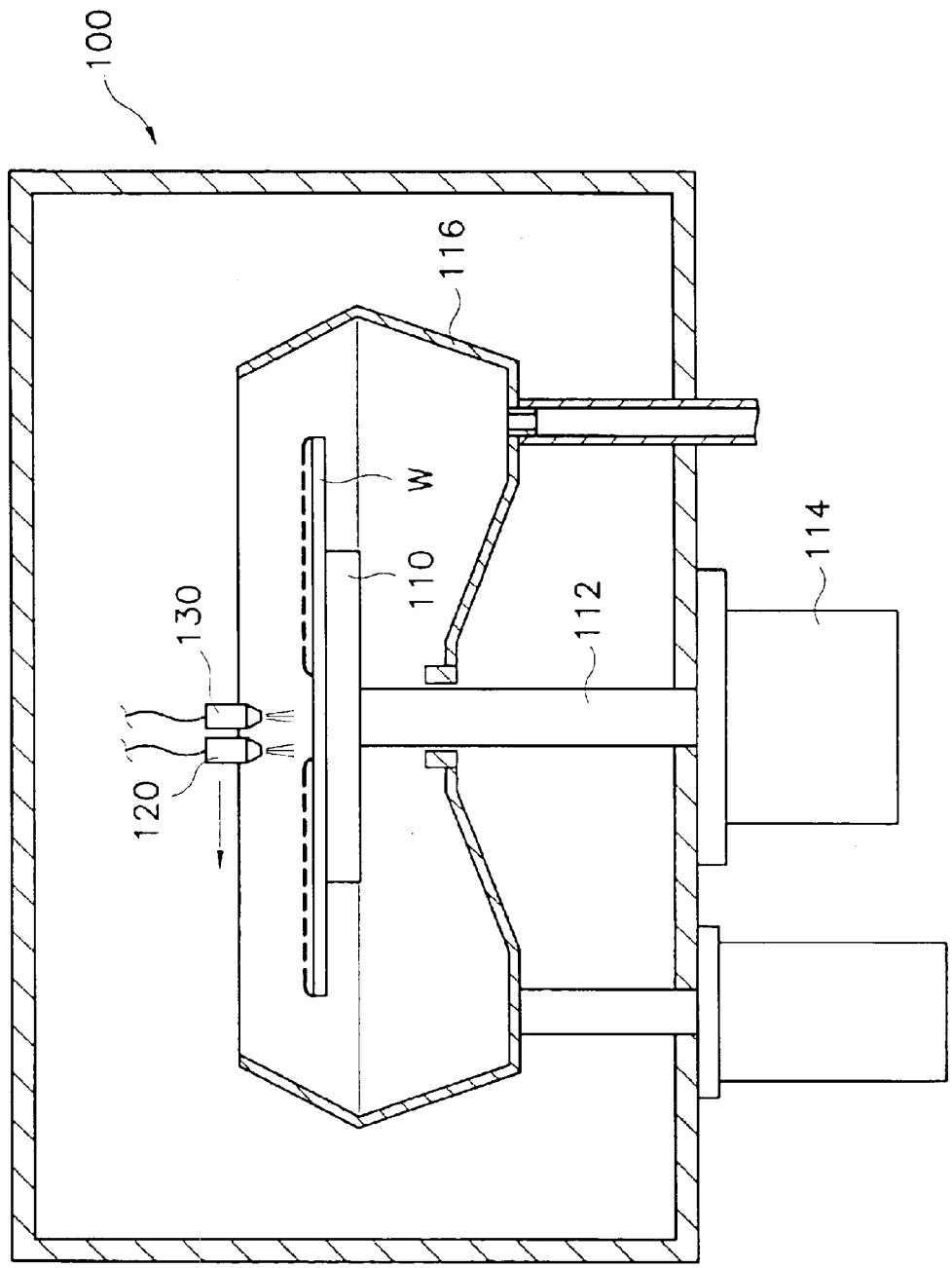
FIG. 1 is a cross-sectional side view illustrating a conventional spin type rapid wafer drying apparatus.
Figure 2:
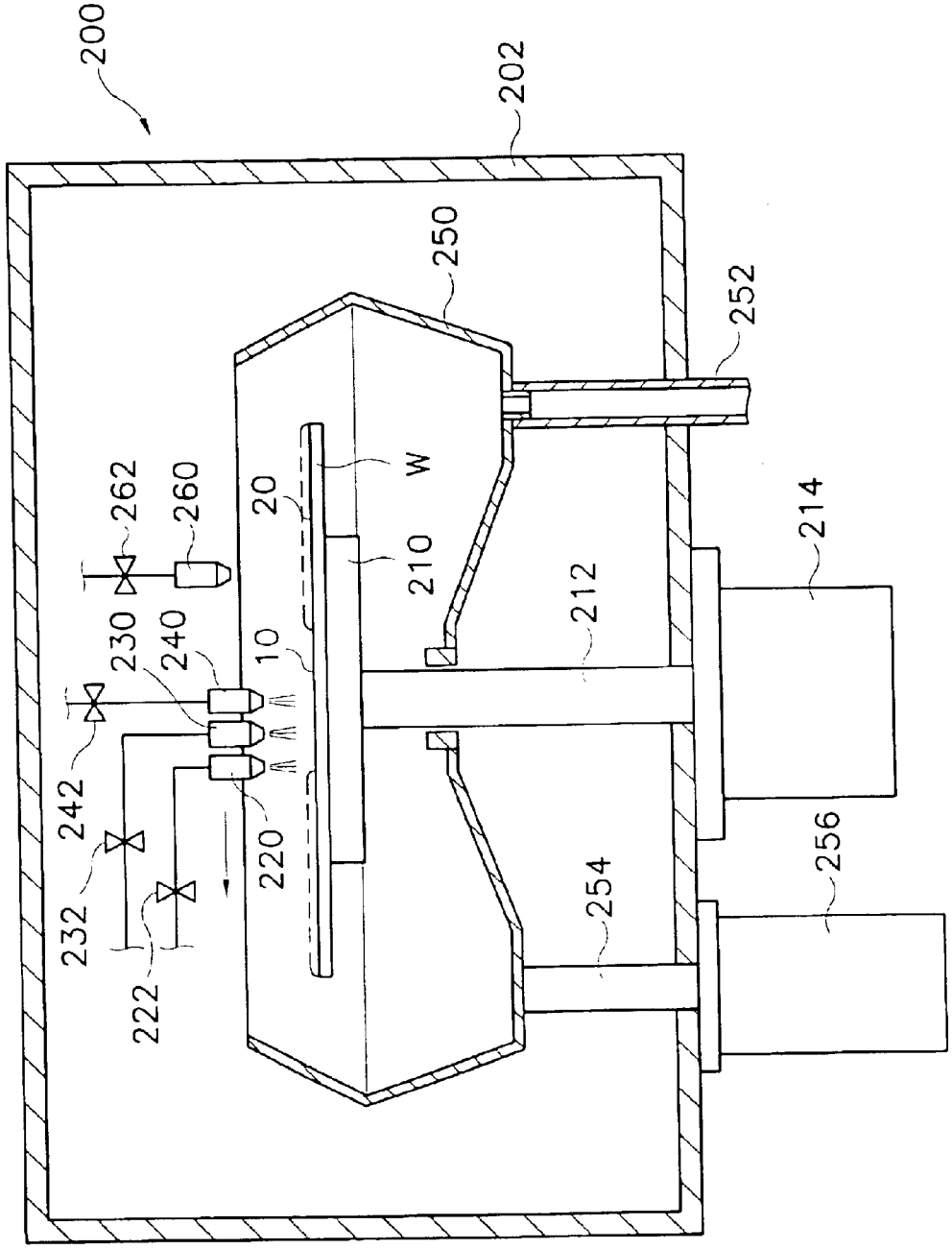
FIG. 2 is a cross-sectional side view illustrating an apparatus for drying a wafer according to first embodiments of the present invention in a first position.

First embodiments of the present invention will now be described with reference to FIGS. 2 and 3. FIG. 2 is a cross-sectional side view illustrating an apparatus for drying a wafer in a first position with movable members adjacent a central portion of the wafer W and FIG. 3 is a cross-sectional side view illustrating the apparatus with movable members adjacent an edge portion of the wafer W.

Figure 3:
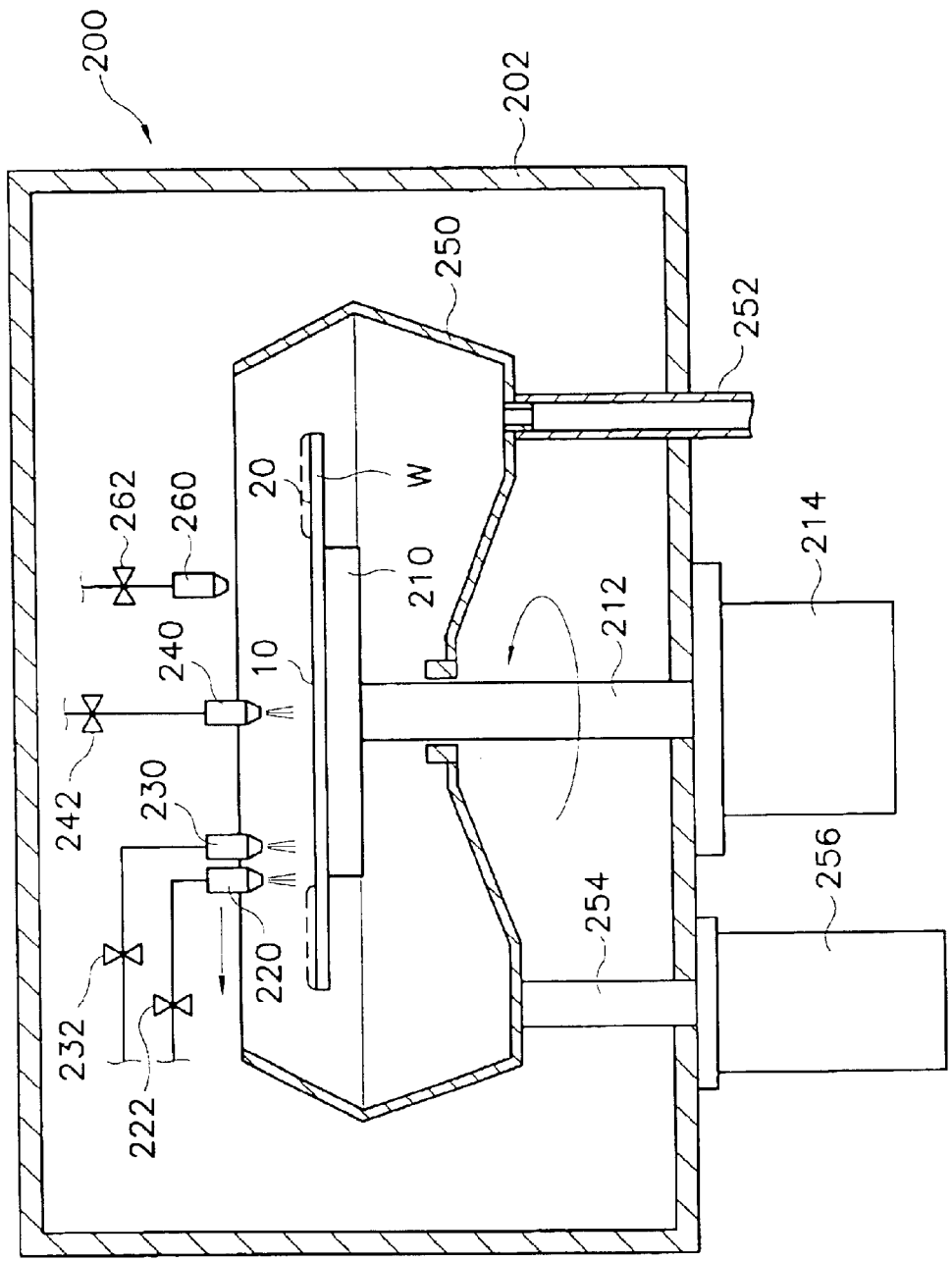
FIG. 3 is a cross-sectional side view illustrating the apparatus of FIG. 2 in a second position.

As shown in FIGS. 2 and 3, a wafer drying apparatus 200 according to the illustrated first embodiments of the present invention includes a rotating chuck 210, a movable de-ionized water supply member 220, a movable first organic solvent supply member 230, and a second organic solvent supply member 240. The rotating chuck 210 holds the wafer W in a horizontal plane and spins (rotates) the wafer W. The de-ionized water supply member 220 supplies de-ionized water onto the wafer W positioned on the rotating chuck 210. The first and the second organic solvent supply members 230 and 240 supply solvent(s), such as an organic solvent, to the wafer W.

A rotary shaft 212 is connected between a first driving part or motor 214 and the rotating chuck 210 in order to provide a rotary force to spin the rotary chuck 210 and, thereby, the wafer W. As shown in FIGS. 2–3, the first driving part 214 is disposed outside of, more particularly, beneath a processing chamber 202. The rotary shaft 212 passes through a bottom portion of the processing chamber 202.

The wafer W may be held to the rotary chuck 210 by a variety of known means, including vacuum. For vacuum grip embodiments, a vacuum line may be formed in the rotating chuck 210 and the rotary shaft 212 to deliver a gripping vacuum to the surface of the rotary chuck 210 on which the wafer W is held. In addition to or instead of the vacuum, the rotary chuck 210 may include another connector, such as a mechanical connector, for example, a clamp or other means mechanically gripping the edge portion of the wafer W.

As shown in FIG. 2, a cover 250 is positioned to enclose the rotating chuck 210. Thus, the cover 250 may block escape of de-ionized water dispersed from the wafer W while the wafer W is being rotated. For the illustrated embodiments, the cover 250 has a cup shape with an open upper face. A drain pipe 252 is connected to the bottom portion of the cover 250 to drain the de-ionized water scattered from the wafer W. The drain pipe 252 extends outside the processing chamber 202 through the bottom portion of the processing chamber 202.

A drive shaft 254 may be connected to the bottom portion of the cover 250 that moves the cover 250 in a vertical direction in facilitate loading and unloading of the wafer W. As illustrated in FIG. 3, the drive shaft 254 is connected to a second driving part 256, such as a piston, that provides vertical movement. The second driving part 256 is disposed beneath the processing chamber 202. The drive shaft 254 penetrates the bottom portion of the processing chamber 202.

The de-ionized water supply member 220 is positioned adjacent a face of and over the wafer W. The de-ionized water supply member 220 is movable radially between a position adjacent a central portion of the wafer W (as shown in FIG. 2) and a position adjacent the edge portion of the wafer W (as shown in FIG. 3).

The first organic solvent supply member 230 is also positioned adjacent a face of and over the wafer W. More particularly, as shown in FIGS. 2 and 3, the movable first organic solvent member 230 is positioned adjacent the de-ionized water supply member 220. The first organic solvent supply member 230 is configured to move along substantially the same path as the de-ionized water supply member 220. The second organic solvent supply member 240 is positioned adjacent to the central portion of the wafer W. As shown in the position of FIG. 2, the second organic solvent supply member 240 is positioned adjacent the first organic solvent supply member 230. The second organic solvent supply member 240 supplies organic solvent onto the wafer W.

As shown in FIG. 2, when drying the wafer W, initially, the second organic solvent supply member 240 is positioned over the central portion of the wafer W. At that time, the second and the first organic solvent supply members 240 and 230, and the de-ionized water supply member 220 are disposed in parallel radially from the central portion of the wafer W toward the edge portion of the wafer W. As shown in FIG. 3, the de-ionized water and the first organic solvent supply members 220 and 230 move from the central portion of the wafer W to the edge portion of the wafer W simultaneously while the wafer W is rotated. Alternatively, the first organic solvent supply member 230 can move after the de-ionized water supply member 220 has completed its movement.

The de-ionized water, the first organic solvent, and the second organic solvent supply members 220, 230 and 240 may have conventional nozzle shapes. The flow rate of the de-ionized water may be controlled by a first flow rate controller 222 and the flow rates of first and second organic solvents may be controlled by second and third flow rate controllers 232 and 242, respectively. The controllers 222, 232, 242 may be, for example, flow control valves and may be operated by an electronic controller or other control means.

As note above, the solvent is preferably an organic solvent. The first and the second organic solvents may, for example, include isopropyl alcohol (IPA). The IPA may be supplied onto the wafer W as a vapor phase solvent. The IPA vapor can be obtained, for example, through a general bubbling process or by heating IPA liquid with a heater. The IPA vapor may be carried using a carrier gas. For example, the carrier gas may be an inert gas, such as nitrogen ($N_2$) gas. In particular embodiments of the present invention, the carrier gas may be a heated nitrogen gas heated to a temperature higher than the boiling point of the IPA. In further embodiments of the present invention, the IPA is provided onto the wafer W in a mist state.

First and second carrier gas supply pipes may be connected to the first and second organic solvent supply members 230 and 240. First and second carrier gases may be respectively sprayed onto the wafer W through the first and second organic solvent supply members 230 and 240. The IPA may be changed into a mist state by the first and the second carrier gases and then the IPA mist may be provided onto the wafer W.

In operation, during the rotation of the wafer W by the first drive part 214, the de-ionized water supply member 220 and the first organic solvent supply member 230 may move together from the central portion of the wafer W to the edge portion of the wafer W. A third driving part may also be provided to move the de-ionized water supply member 220 and the first organic solvent supply member 230 toward the edge portion of the wafer W. For example, the third drive part may be a ball screw connected to a motor and a ball block. The third drive part can also include, for example, a linear motor and an oil/air pressure cylinder.

A fourth drive part may be provided to move the de-ionized water supply member 220 and the first and second organic solvent supply members 230 and 240 in the vertical or the horizontal directions to facilitate loading and/or unloading of the wafer W into and/or from the processing chamber 202.

A dry gas supply member 260 is also illustrated in FIGS. 2 and 3. After the de-ionized water supply member 220 and the first organic solvent supply member 230 move to the edge portion of the wafer W, the dry gas supply member 260 may be used to supply a heated or room temperature dry gas onto the surface (face) of the wafer W to further facilitate drying of the wafer W. The dry gas may be, for example, an inert gas such as a nitrogen gas. The flow rate of the dry gas may be controlled by a fourth flow rate control part 262.

After the wafer W goes through a cleaning process and a final rinsing process, the de-ionized water remaining on the surface of the wafer W is removed from the wafer W as a result of the centrifugal force from rotation of the wafer W. The de-ionized water supply member 220 provides de-ionized water onto the rotating wafer W to limit or prevent natural drying of water on the surface of the wafer W, which may result in watermarks. The de-ionized water is preferably all removed by the rotation of the wafer W. The organic solvents may facilitate spin drying by reducing the surface tension of the de-ionized water and improved drying efficiency of the wafer W may result.

After the de-ionized water is dispersed from the wafer W by spinning, the dispersed de-ionized water is retained by means of the cover 250 and the de-ionized water flows downwardly along the inner sidewall of the cover 250. However, the de-ionized water can be re-deposited on the dried portion 10 of the wafer W. Accordingly, as illustrated in FIGS. 2 and 3, the second organic solvent supply member 230 is provided that supplies organic solvent onto the wafer W to facilitate removing of de-ionized water re-deposited on the dried portion 10. Thus, the introduction of watermarks caused by the de-ionized water being re-deposited on the dried portion 10 can be reduced or prevented because the organic solvent is sprayed onto the wafer W. In FIGS. 2 and 3, the reference numeral 20 indicates the not yet dried portion of the wafer W.

Figure 4:
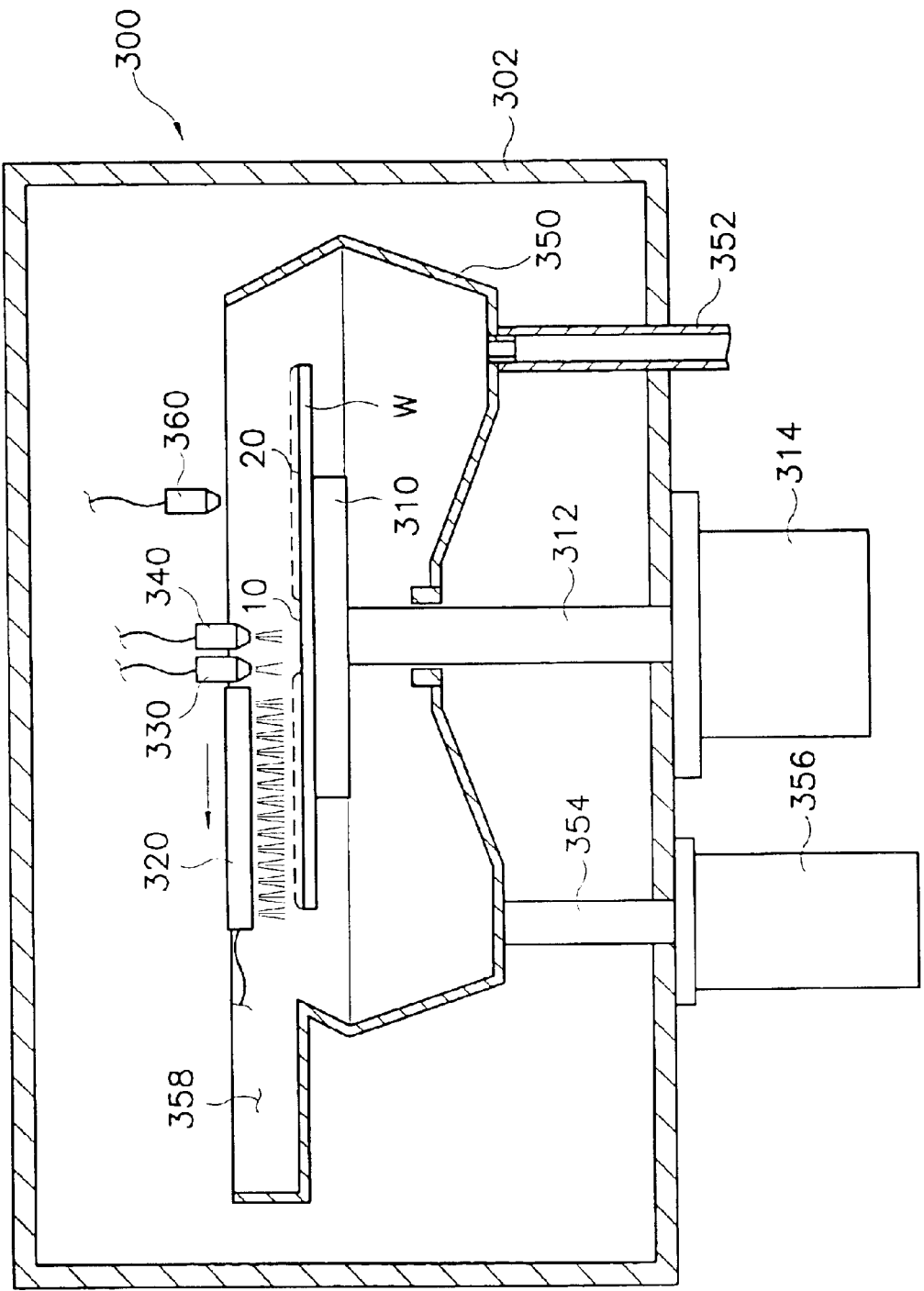
FIG. 4 is a cross-sectional side view illustrating an apparatus for drying a wafer according to second embodiments of the present invention in a first position.
Figure 5:
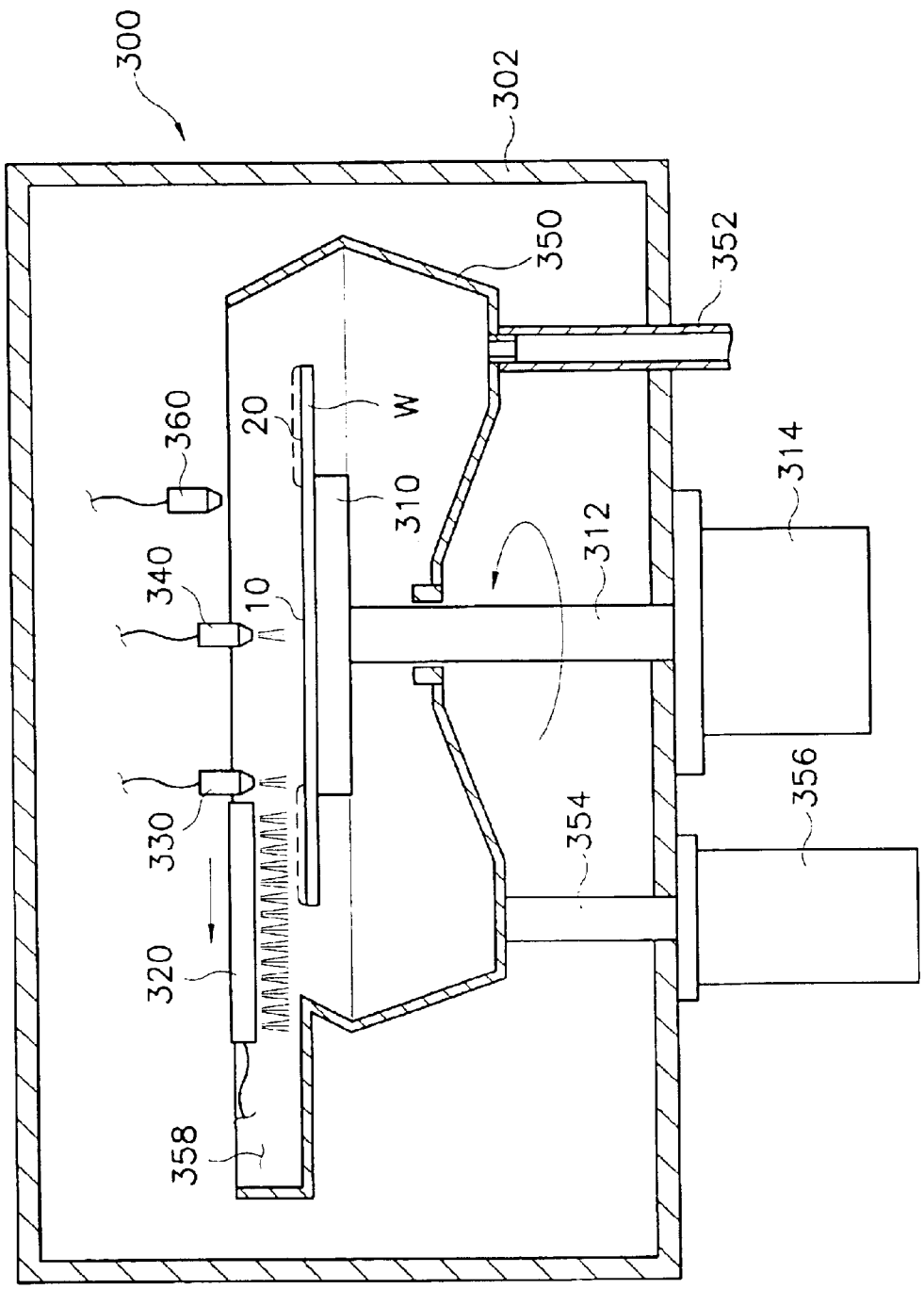
FIG. 5 is a cross-sectional side view illustrating the apparatus of FIG. 4 in a second position.
Figure 6:
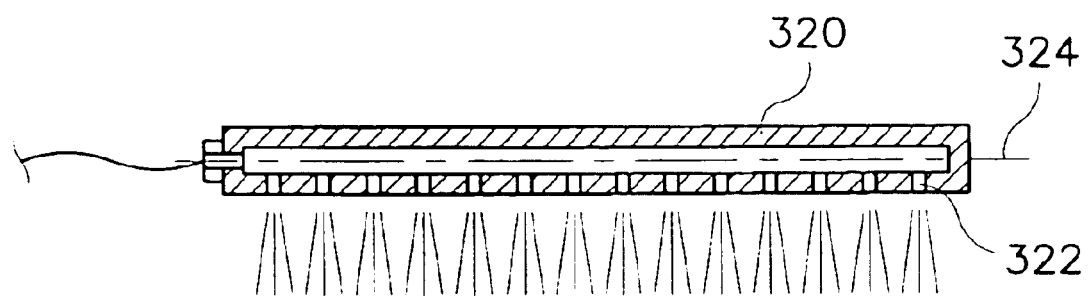
FIG. 6 is a cross-sectional side view illustrating embodiments of the de-ionized water supply member of FIGS. 4 and 5.

Further embodiments of the present invention will now be described with reference to FIGS. 4–6. FIG. 4 is a cross-sectional side view illustrating an apparatus for drying a wafer in a first position and FIG. 5 is a cross-sectional side view illustrating the apparatus of FIG. 4 in a second position. FIG. 6 is a cross-sectional side view illustrating embodiments of the de-ionized water supply member of FIG. 4.

The embodiments of a wafer drying apparatus 300 illustrated in FIGS. 4 to 6 include a rotating chuck 310, a de-ionized water supply member 320, a first organic solvent supply member 330 and a second organic solvent supply member 340. The rotating chuck 310 grips the wafer W in a horizontal plane and rotates the wafer W. The de-ionized water supply member 320 supplies de-ionized water onto the wafer W. The first and second organic solvent supply members 330 and 340 provide the wafer W with respective organic solvents.

The embodiments in FIGS. 4–5 are illustrated with a spin drive system substantially the same as was described with reference to FIGS. 3–4. A rotary shaft 312 connects the rotating chuck 310 to a first drive part or motor 314 through the bottom portion of the processing chamber 302 to provide a rotation force. The cover 350 has a cup shape and is positioned to enclose the rotating chuck 310. A drain pipe 352 is connected to the bottom portion of the cover 350 to drain the de-ionized water removed from the wafer W. A drive shaft 354 and a second drive part 356 are connected to the bottom portion of the cover 350 and provided for moving the cover 350 in the vertical direction to facilitate loading and unloading of the wafer W.

The embodiments of FIGS. 4–5 differs in that the de-ionized water supply member 320 is a longitudinally extending member extending radially from the central portion of the wafer W and includes a plurality of de-ionized water nozzles 322. The de-ionized water supply member 320 may have a pipe shape. The plurality of de-ionized water supply nozzles 322 face the wafer W and are disposed along the central axis of the de-ionized water supply member 320 for the embodiments illustrated in FIGS. 4–6. The de-ionized water supply member 320 provides the de-ionized water onto the surface of the wafer W while the de-ionized water supply member 320 moves from the central portion of the wafer W to the edge portion of the wafer W. Thus, the de-ionized water may be operatively supplied onto the wafer W during the drying process. As a result, natural drying of the not yet dried portion 20 of the wafer W may be prevented and the occurrence of watermarks due to the natural drying of the wafer W may be reduced or eliminated. In particular, the edge portion of the wafer W may be less likely to be naturally dried during the drying process due to the extended coverage of the de-ionized water supply member 320 and watermarks cannot be generated at the edge portion of the wafer W.

To accommodate the de-ionized water supply member 320, a space 358 may be provided adjacent to the cover 350 that receives the de-ionized water supply member 320 and de-ionized water therefrom when the de-ionized water supply member 320 is adjacent the edge portion of the wafer W as illustrated in FIG. 5.

While the first organic solvent supply member 330 moves between the positions illustrated in FIGS. 4 and 5, either along with or following the passage of the de-ionized water supply member 320, the first organic solvent supply member 330 provides organic solvent onto the wafer W. The second organic solvent supply member 340 supplies organic solvent onto the central portion of the wafer W to facilitate removal of de-ionized water re-deposited on the dried portion 10 of the wafer W. After the de-ionized water supply member 320 and the first organic solvent supply member 330 move to the edge portion of the wafer W, shown in FIG. 5, a dry gas supply member 360 may supply a dry gas onto the surface of the wafer W to complete drying of the wafer W.

For the embodiments illustrated in FIGS. 4–5, the first and the second organic solvent supply members 330 and 340 and the dry gas supply member 360 are substantially the same as described with reference to FIGS. 2–3. Accordingly, further description of the first and the second organic solvent supply members 330 and 340 and the dry gas supply member 360 will be omitted. FIG. 6 is a cross-sectional side view further illustrating embodiments of the de-ionized water supply member 320, including a plurality of de-ionized water supply nozzles 322 extending along a central axis 324 thereof.

Figure 7:
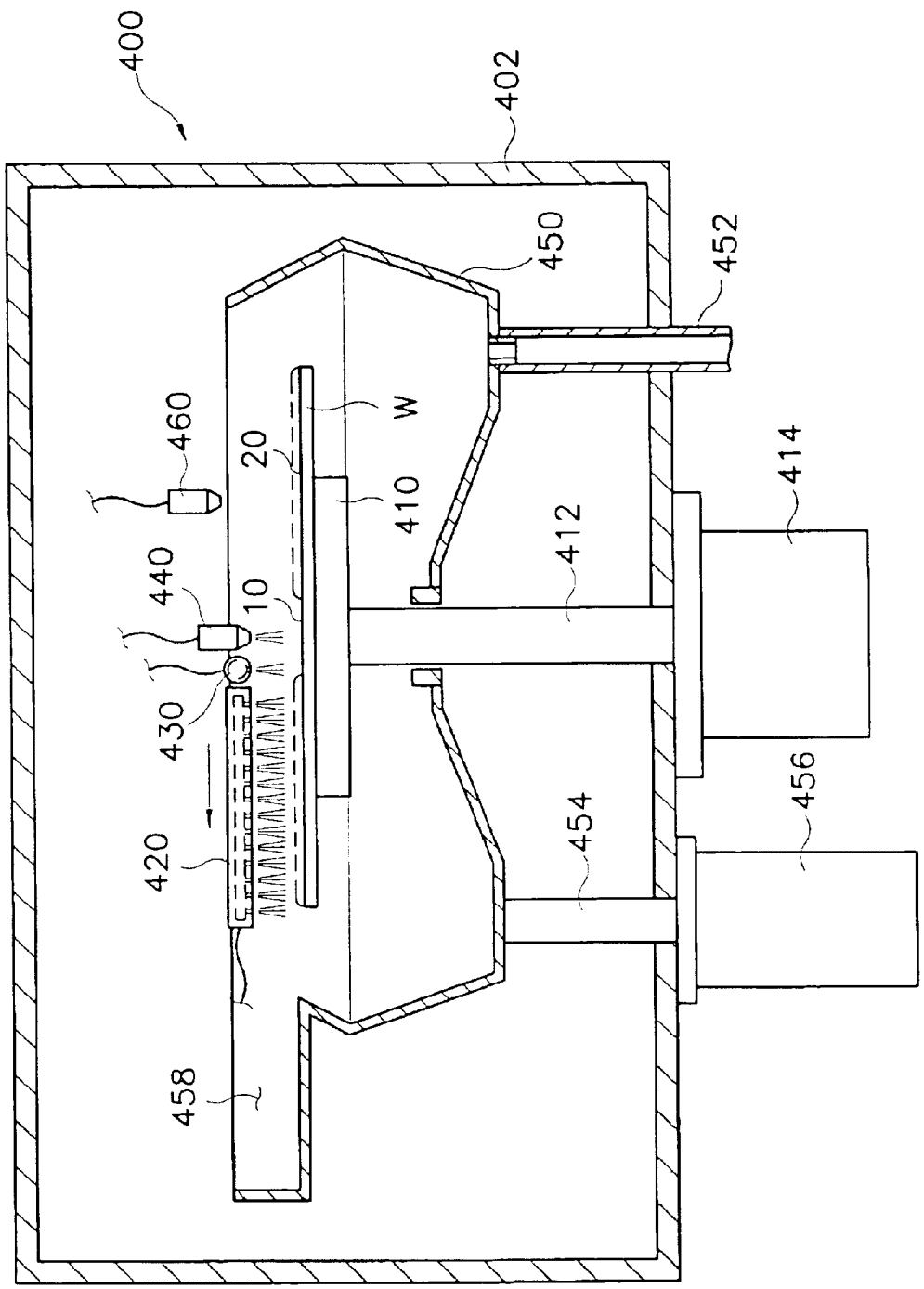
FIG. 7 is a cross-sectional side view illustrating an apparatus for drying a wafer according to third embodiments of the present invention.
Figure 8:
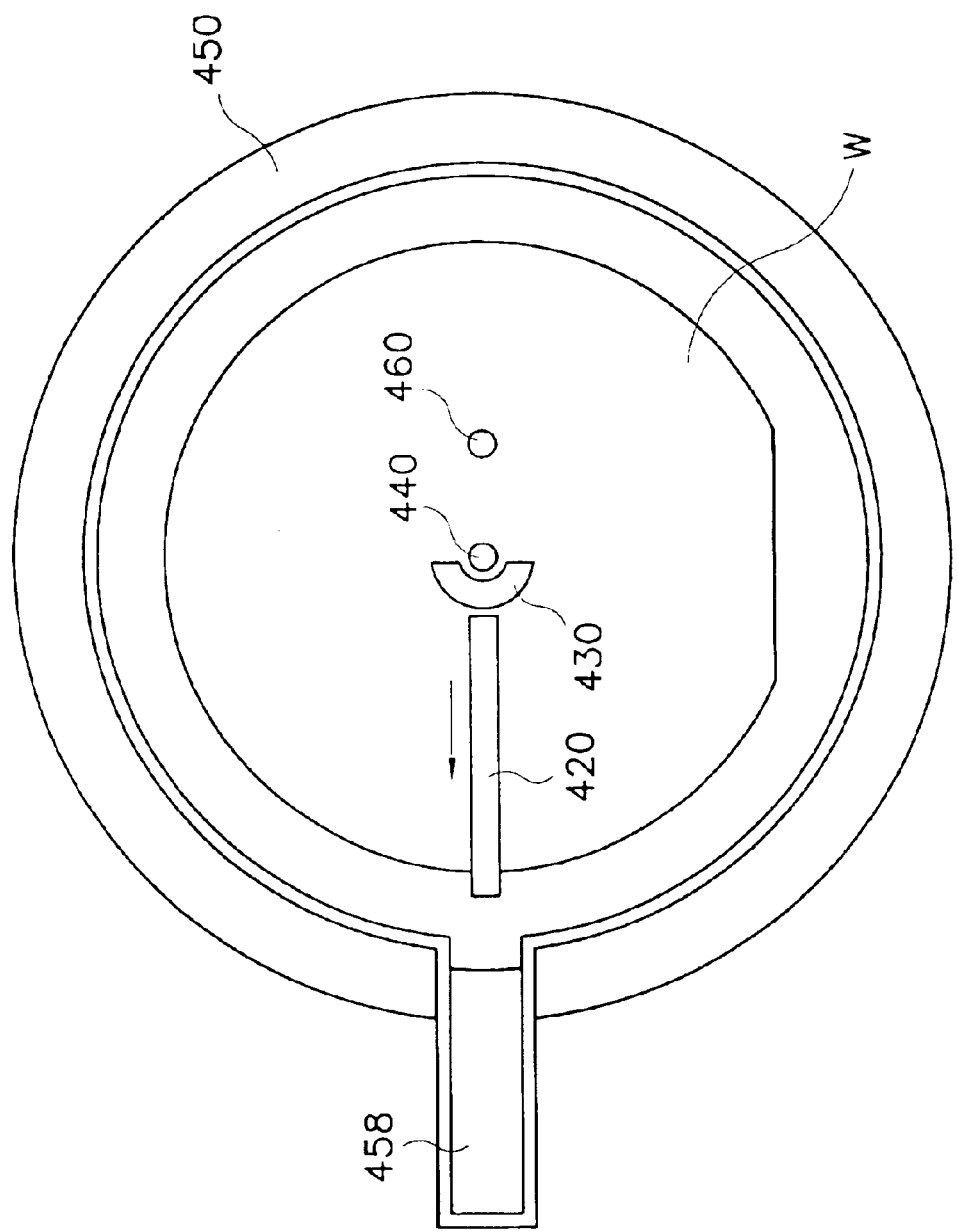
FIG. 8 is a top plane view illustrating the apparatus of FIG. 7 in a first position.
Figure 9:
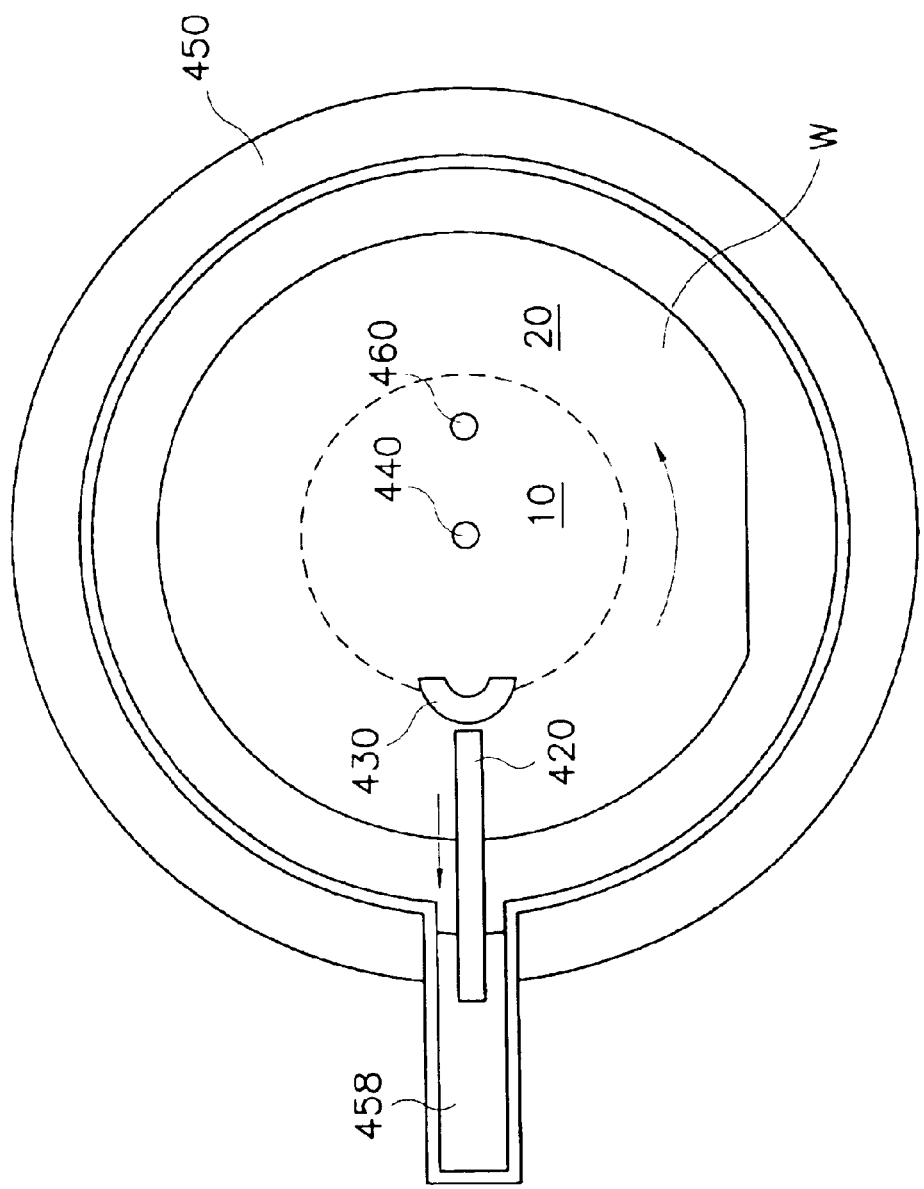
FIG. 9 is a top plane view illustrating the apparatus of FIG. 7 in a second position.
Figure 10:
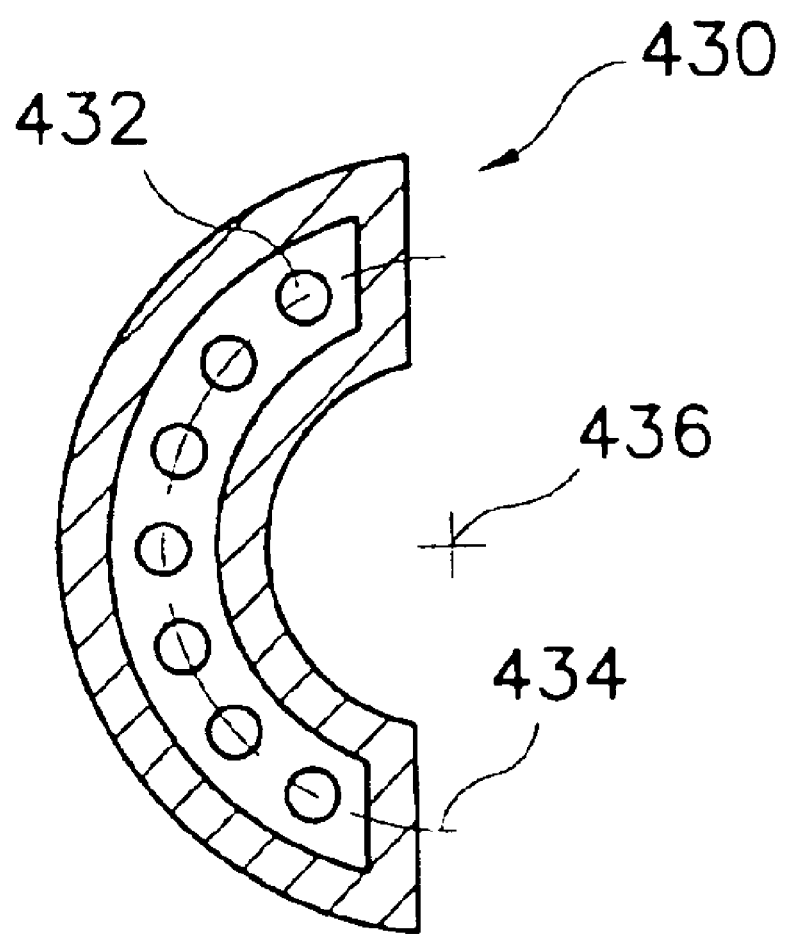
FIG. 10 is a cross-sectional plane view illustrating embodiments of the first organic solvent supply member of FIGS. 7–9.

Further embodiments of the present invention will now be described with reference to FIGS. 7–10. FIG. 7 is a cross-sectional side view illustrating an apparatus for drying a wafer. FIG. 8 is a top plane view illustrating the apparatus of FIG. 7 in a first position and FIG. 9 is a top plane view illustrating the apparatus of FIG. 7 in a second position. FIG. 10 is a cross-sectional view illustrating embodiments of the first organic solvent supply member of the apparatus of FIG. 7.

Referring now to FIGS. 7 to 10, a wafer drying apparatus 400 includes a rotating chuck 410, a de-ionized water supply member 420, a first organic solvent supply member 430 and a second organic solvent supply member 440. As with the previously described embodiments, the rotating chuck 410 holds the wafer W in a horizontal plane and rotates the wafer W during spin drying. The de-ionized water supply member 420 supplies de-ionized water onto the wafer W. The first and second organic solvent supply members 430 and 440 provide organic solvents onto the wafer W.

As with the previously described embodiments, a mechanical drive mechanism is illustrated for the spin drying apparatus in FIG. 7. A rotary shaft 412 connects the rotating chuck 410 through the bottom portion of the cover 450 and processing chamber 402 to a first drive part or motor 414 to transfer a rotation force to the rotary chuck 410. A cup shaped cover 450 is positioned to enclose the rotating chuck 410. A drain pipe 452 is connected to the bottom portion of the cover 450 to drain de-ionized water removed from the wafer W. Also shown in FIG. 7 are a drive shaft 454 and a second driving part 456, such as a piston, that are connected to the bottom portion of the cover 450 to move the cover 450 in the vertical direction so as to facilitate loading and unloading of the wafer W.

The de-ionized water supply member 420 is longitudinally extending in a radial direction. As shown in FIGS. 7–9, the de-ionized water supply member 420 has a pipe shape and extends from the central portion of the wafer W to the edge portion of the wafer W. The de-ionized water supply member 420 has a plurality of de-ionized water supply nozzles facing with the wafer W that are disposed along the central axis of the de-ionized water supply member 420 as was described with reference to the embodiments of FIG. 6. The de-ionized water supply member 420 provides de-ionized water onto the surface of the wafer W while the de-ionized water supply member 420 moves from the central portion of the wafer W to the edge portion of the wafer W. As a result, likelihood of natural drying of the not yet dried portion 20 of the wafer W is reduced and watermarks from natural drying may be reduced or eliminated. As with the like numbered features described with reference to FIGS. 4–5, a space 458 is provided adjacent to the cover 450 for receiving de-ionized water and the de-ionized water supply member 420.

The first organic solvent supply member 430 moves along substantially the same path as the de-ionized water supply member 420, either concurrently therewith or following movement of the de-ionized water supply member 420, while providing organic solvent onto the wafer W. However, the first organic solvent supply member 430 differs from that described with reference to the previous embodiments in that it is an arcuate shaped member including a plurality of nozzles. The arcuate shape is noted schematically in FIG. 7. As shown in FIGS. 8 and 9, the arcuate shaped portion is concave with reference to a central axis of the wafer W and the rotary chuck 410 (FIG. 7). As best seen in FIG. 10, a plurality of organic solvent supply nozzles 432, positioned to face the wafer W, are disposed along the curved center line (central axis) 434 of the first organic solvent supply member 430. The shape of the first organic solvent supply member 430 is referred to herein as a curved pipe shape having an arcuate curve relative to the curved central point 436, which is positioned between the first organic solvent supply member 430 and the central portion of the wafer W (the central axis of the rotary chuck 410). For some embodiments of the present invention, at the commencement of the drying process for the wafer W, the curved central point 436 of the first organic solvent supply member 430 aligns with the central axis of the rotary chuck 410 and the wafer W. The configuration of the first organic solvent supply member may improve drying efficiency for the wafer W.

As shown in FIGS. 7–9, the second organic solvent supply member 440 supplies the organic solvent onto the central portion of the wafer W and, thereby, may facilitate removal of re-deposited de-ionized water rebounded from the cover 450. In addition, a dry gas supply member 460 may supply a dry gas onto the surface of the wafer W to further dry the wafer W after the de-ionized water supply member 420 and the first organic solvent supply member 430 move to the edge portion of the wafer W (position illustrated in FIG. 9). Note that the position illustrated in FIG. 8 corresponds generally to that shown in FIG. 7.

Figure 11:
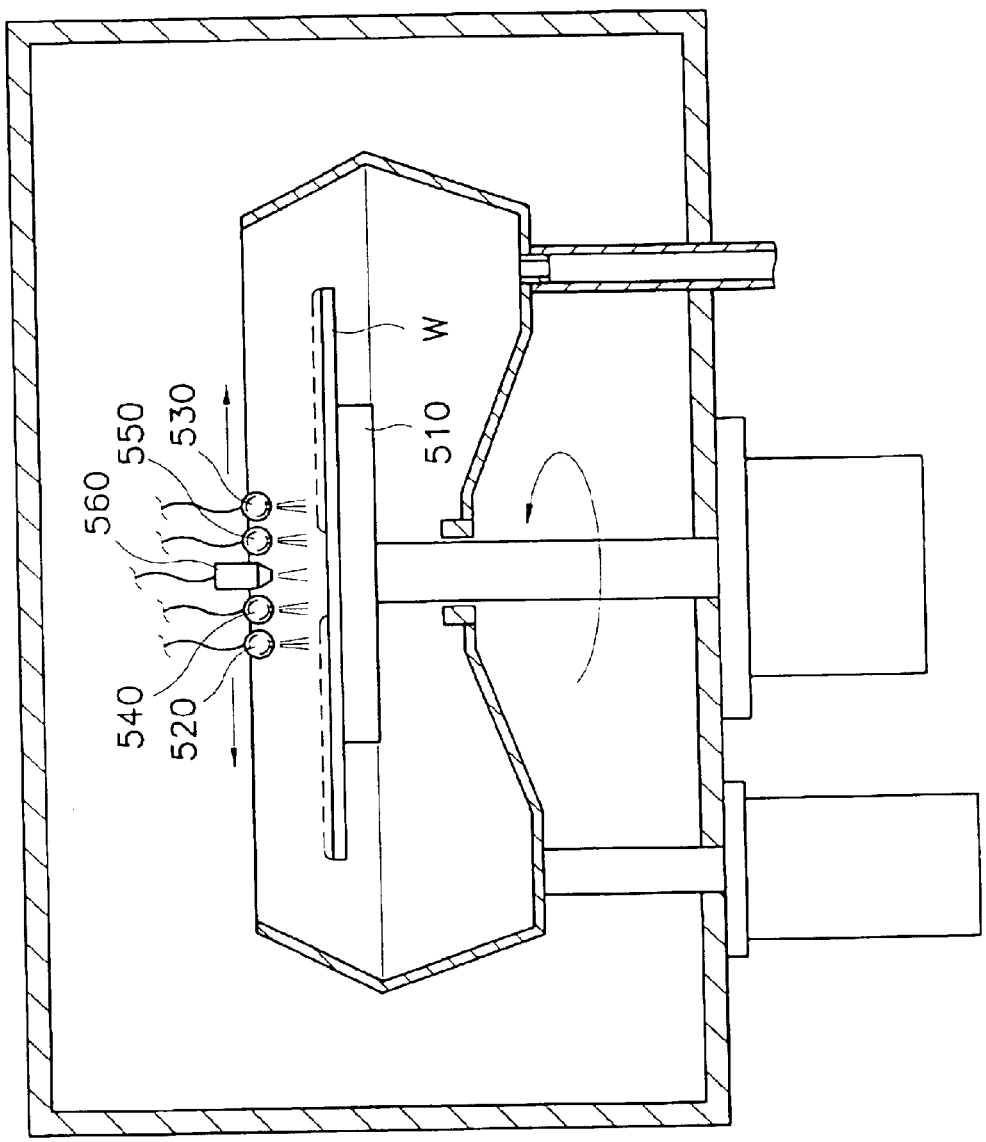
FIG. 11 is a cross-sectional view side illustrating an apparatus for drying a wafer according to fourth embodiments of the present invention.
Figure 12:
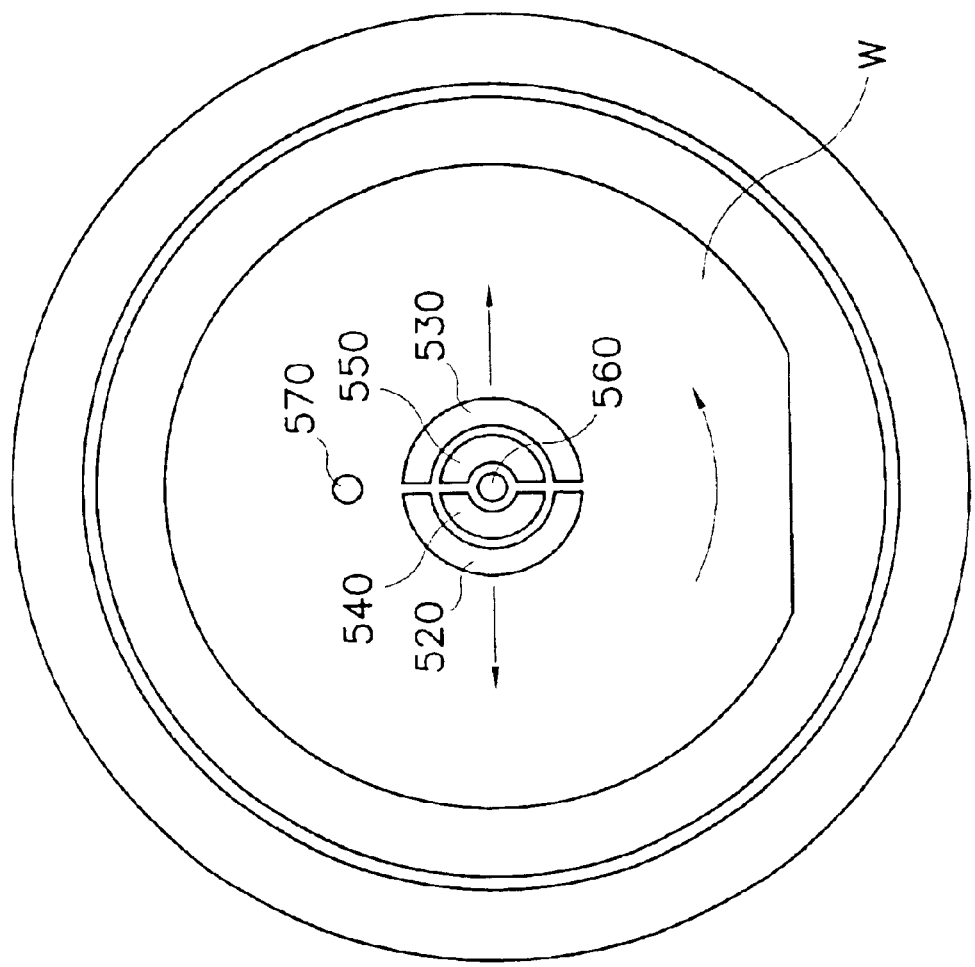
FIG. 12 is a top plane view illustrating the apparatus of FIG. 11 in a first position.
Figure 13:
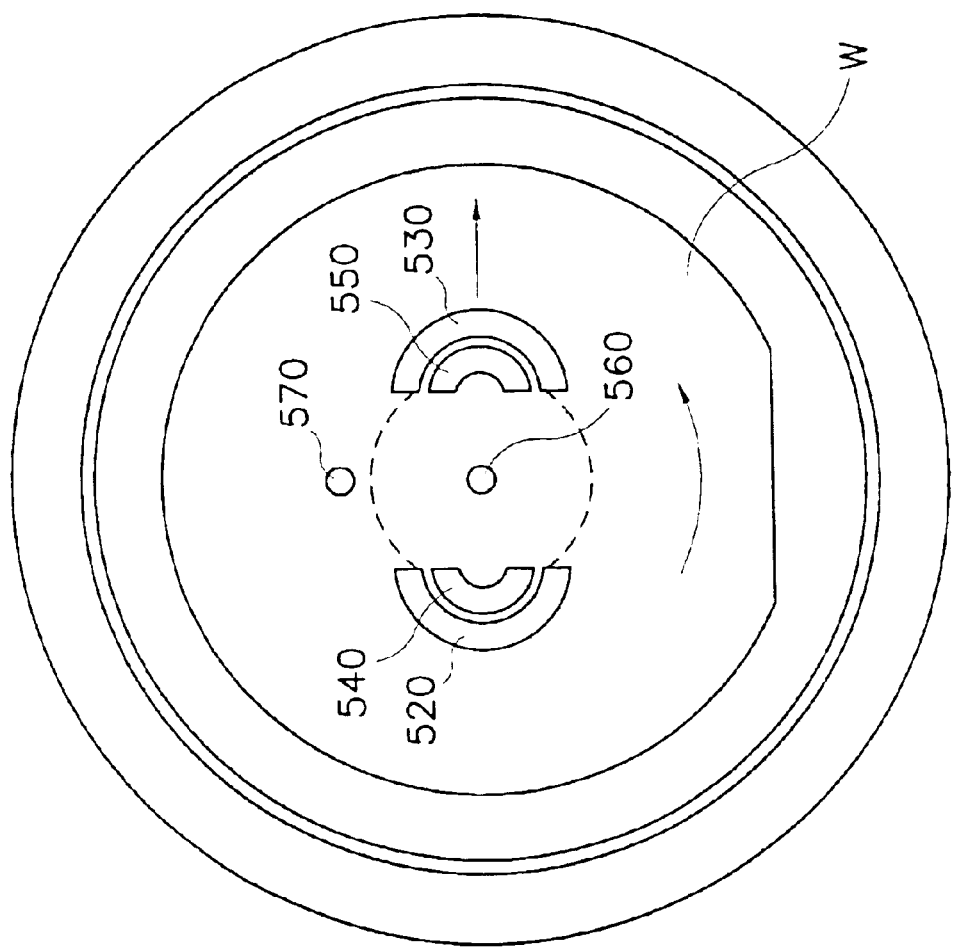
FIG. 13 is a top plane view illustrating the apparatus of FIG. 11 in a second position.
Figure 14:
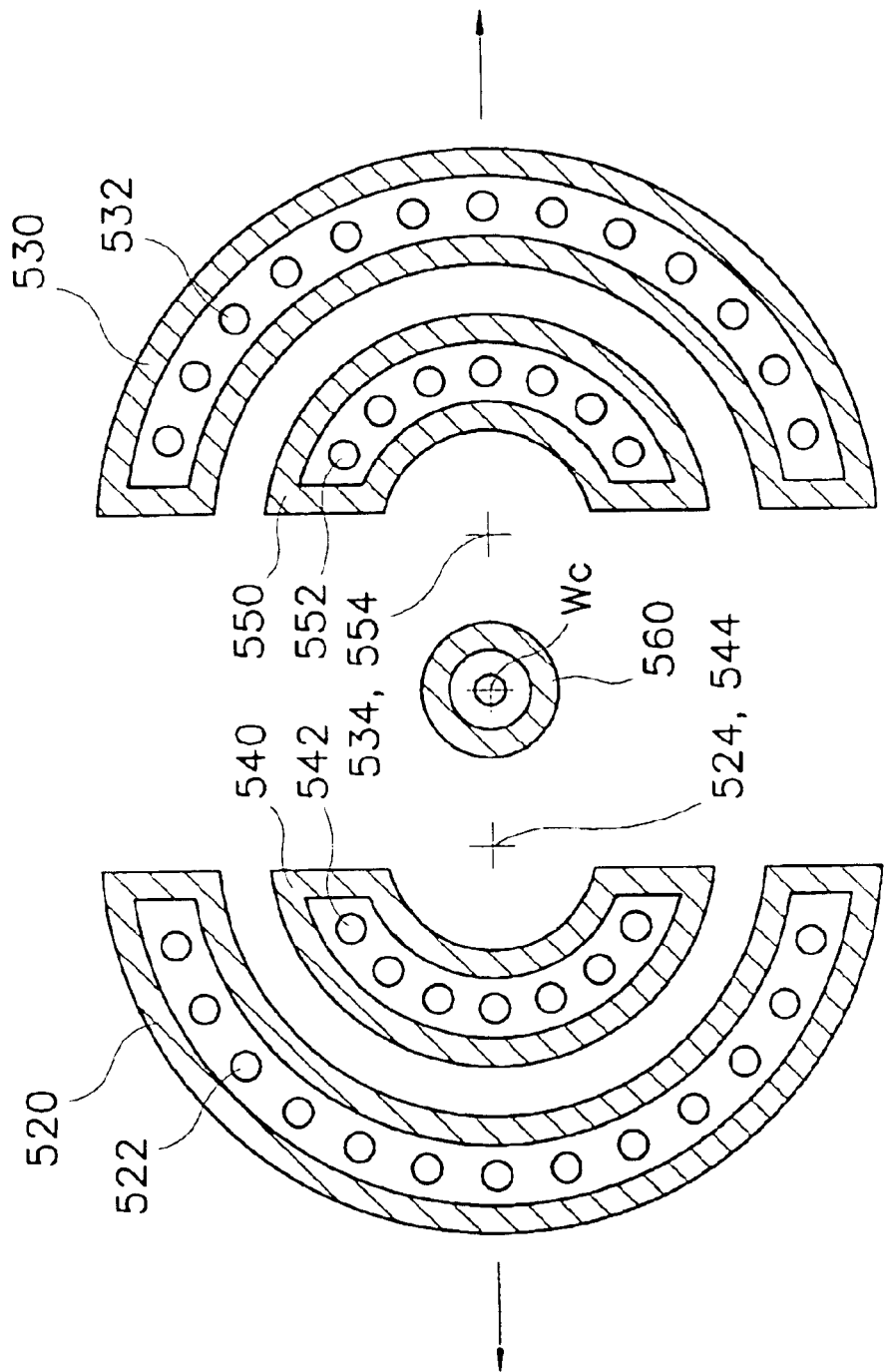
FIG. 14 is a cross-sectional plane view illustrating embodiments of the de-ionized water supply member and first and second organic solvent supply members of FIGS. 11–13.

Further embodiments of the present invention will now be described with reference to FIGS. 11–14, in which both the de-ionized water supply member and the first organic solvent supply member are arcuate shaped and in which two of each may be provided. FIG. 11 is a cross-sectional side view, FIG. 12 is a plane top view illustrating a first position corresponding to that in FIG. 11, FIG. 13 is a plane top view illustrating a second position and FIG. 14 is a cross-sectional view illustrating embodiments of the de-ionized water supply member and first and second organic solvent supply members of the apparatus of FIGS. 11–13. The arcuate shape is noted schematically in FIG. 11.

Referring now to FIGS. 11 to 14, movable de-ionized water supply member 520, 530 and a movable first organic solvent supply member 540 and a movable second organic solvent supply member 550 are disposed over the wafer W. The de-ionized water supply member 520, 530 includes a first de-ionized water supply part 520 and a second de-ionized water supply part 530. The first de-ionized water supply part 520 is arcuate and, more particularly, is illustrated as having a curved pipe shape. The second de-ionized water supply part 530 is similarly shaped. As seen in FIG. 12, the second de-ionized water supply part 530 is positioned on an opposite side of the central axis of the rotary chuck 510 (FIG. 11) from the first de-ionized water supply part 520 and is movable in an opposite direction from the first de-ionized water supply part 520 (see arrows in FIG. 12 and compare FIGS. 12 and 13). The first and second de-ionized water supply parts 520, 530 are concave with reference to the central axis of the rotary chuck 510. In other words, the first de-ionized water supply part 520 is disposed so that the first curved center of the first de-ionized water supply part 520 (or an inner surface of the first de-ionized water supply part 520) faces the center Wc (FIG. 14) of the wafer W. The center Wc of the wafer W corresponds to the central axis of the rotary chuck 510. The second de-ionized water supply part 530 may have the same shape as in the first de-ionized water supply part 520 and the second de-ionized water supply part 530 faces the first de-ionized water supply part 520 (so that the inner surface of the second de-ionized water supply part 530 faces the outer surface of the first de-ionized water supply part 520).

Referring to FIG. 14, at the start of the drying process for the wafer W, the first curved center 524 of the first de-ionized water supply part 520 may be aligned with the center Wc of the wafer W and the second curved center 534 of the second de-ionized water supply part 530 may be aligned with the center Wc of the wafer W. In such embodiments, the first and second de-ionized water supply parts 520 and 530 are circularly disposed centering around the wafer W at the start of the drying process. A plurality of de-ionized water supply nozzles 522 and 532 facing the wafer W are formed in the first and the second de-ionized water supply parts 520 and 530. The first and the second de-ionized water supply parts 520 and 530 move in opposite directions to each other from the central portion of the wafer W (FIG. 12) to the edge portion of the wafer W while spraying de-ionized water onto the wafer W.

For the embodiments illustrated in FIGS. 11–14, the first organic solvent supply member 540 and the second organic solvent supply member 550 have a concave arcuate shape similar to the first and second de-ionized water supply parts 520 and 530. The first and second movable organic solvent supply members 540 and 550 are positioned between the first and second de-ionized water supply parts 520 and 530 (in other words, between the respective de-ionized water supply parts 520, 530 and the central axis Wc of the rotary chuck 510). The first and second organic solvent supply members 540 and 550 move across the wafer W, either concurrently with or following movement of the de-ionized water supply parts 520, 530, while providing organic solvents onto the wafer W. The organic solvents are supplied through a plurality of organic solvent supply nozzles 542 and 552 formed in the first and the second organic solvent supply members 540 and 550.

Referring to FIG. 14, in some embodiments of the present invention, at the beginning of the drying process, the third curved center 544 of the first organic solvent supply part 540 aligns with the center Wc of the wafer W and the fourth curved center 554 of the second organic solvent supply member 550 aligns with the center Wc of the wafer W. That is, the first and second organic solvent supply members 540 and 550 are circularly disposed around the wafer W. At that time, the first and second de-ionized water supply parts 520 and 530 enclose the first and second organic solvent supply members 540 and 550.

A third organic solvent supply member 560 may supply an organic solvent onto the central portion of the wafer W. A dry gas supply member 570 may provide a dry gas onto the wafer W after movement of the first and second de-ionized water supply parts 520 and 530 and the first and the second organic solvent supply members 540 and 550 is finished.

The embodiments illustrated in FIGS. 11–14 include dual symmetrical de-ionized water supply parts 520, 530 and movable organic solvent supply members 540, 550. However, it is to be understood that a single one of each may be utilized instead of the illustrated symmetrical pairs. In other words, the wafer W may be dried using the first de-ionized water supply part 520, the first organic solvent supply member 540. In such embodiments, the second de-ionized water supply part 530 and the second organic solvent supply member 550 may be omitted.

Figure 15:
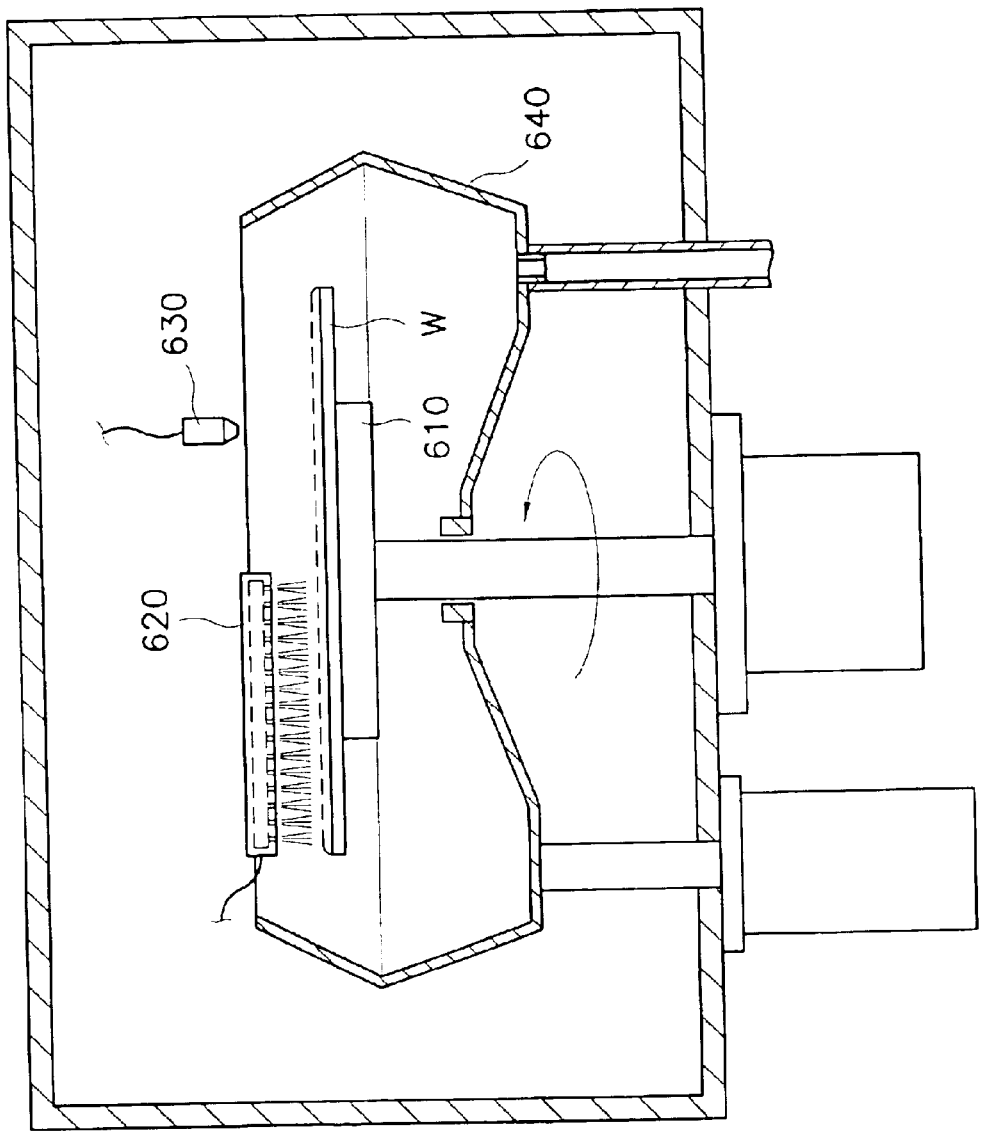
FIG. 15 is a cross-sectional side view illustrating an apparatus for drying a wafer according to fifth embodiments of the present invention.

Further embodiments of the present invention will now be described with reference to FIGS. 15–17. FIG. 15 is a cross-sectional side view illustrating an apparatus for drying a wafer and FIGS. 16 and 17 are perspective views illustrating various embodiments of the organic solvent supply member of FIG. 15.

Figure 16:
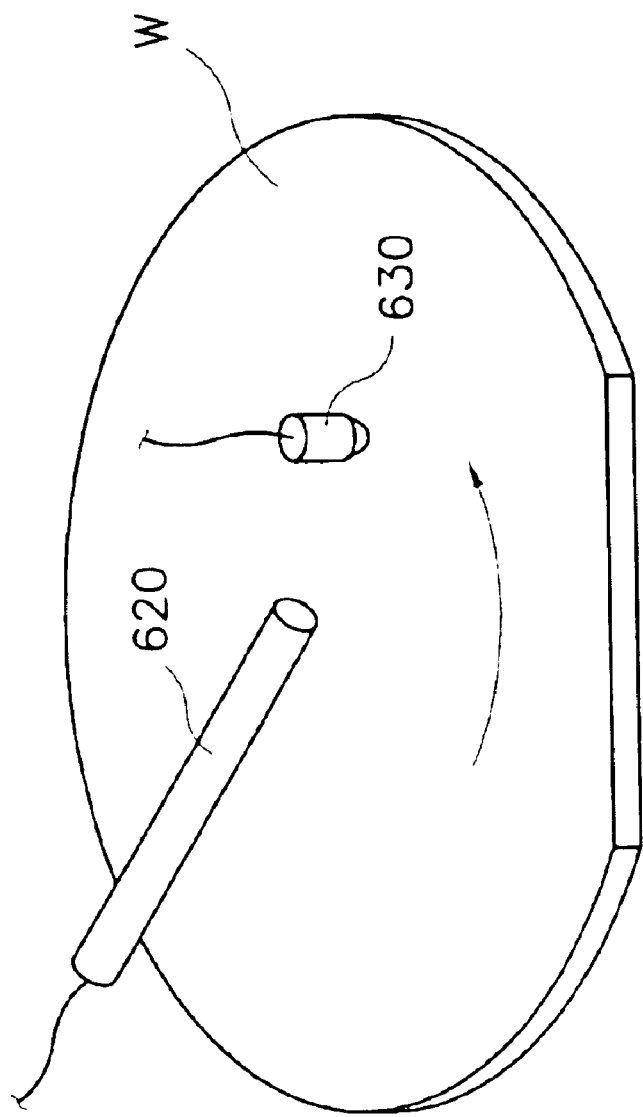
FIG. 16 is a perspective view illustrating the apparatus of FIG. 15.
Figure 17:
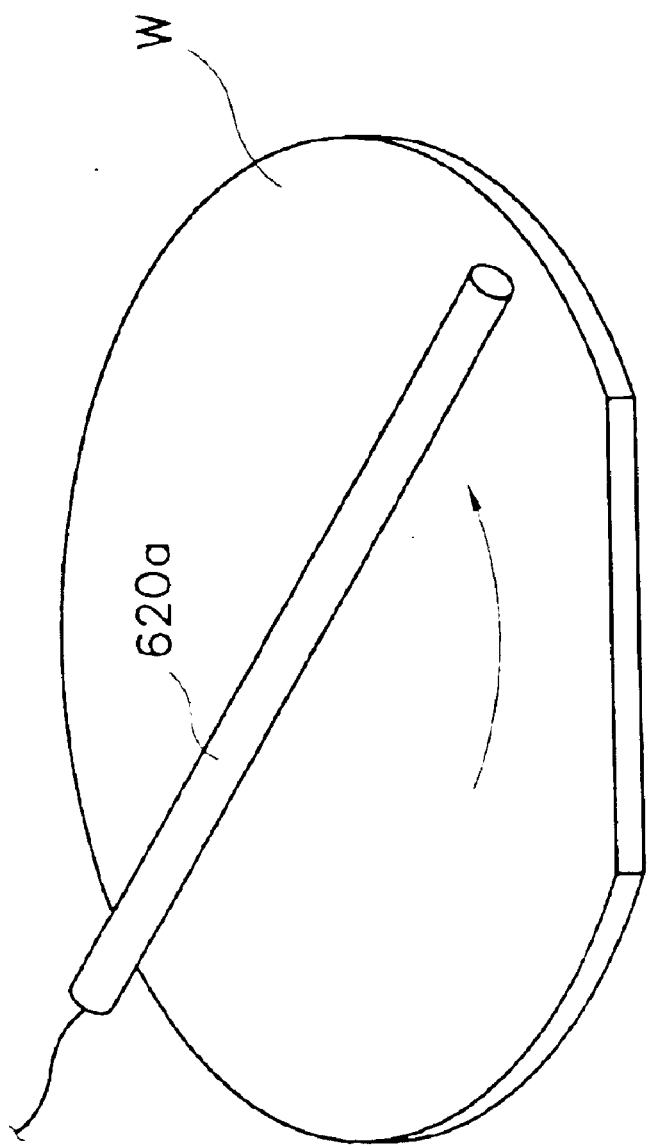
FIG. 17 is a perspective view illustrating further embodiments of the present invention.

Referring to FIGS. 15 and 16, an organic solvent supply member 620 is disposed over and supplies organic solvent onto the wafer W, which is supported and rotated by a rotating chuck 610. The organic solvent supply member 620 is a longitudinally extending member and, more particularly, is illustrated as having a pipe shape extended from the central portion of the wafer W to the edge portion of the wafer W. A plurality of organic solvent supply nozzles facing the wafer W is disposed along a central axis of the organic solvent supply member 620. For the embodiments illustrated in FIGS. 15 and 16, the length of the organic solvent supply member 620 is substantially identical to the radius of the wafer W. Therefore, the organic solvent can be uniformly provided onto the entire surface of the wafer W without movement of the organic solvent supply member 620. The organic solvent, as described previously, may be a vapor phase solvent.

A dry gas supply member 630 supplying a heated dry gas may be positioned over the wafer W to further dry the wafer W, which may be primarily dried by the rotation of the wafer W while being provided with organic solvent.

The organic solvent supply member 620 can substantially uniformly supply the organic solvent onto the entire surface of the rotating wafer W, which may reduce the time for drying the wafer W, and the generation of the watermark at the edge portion of the wafer W can be inhibited or even prevented. In addition, the incidence of watermarks from re-deposited de-ionized water on a previously dried surface of the wafer W can be inhibited or prevented as re-deposited de-ionized water rebounded from a cover 640 may be removed. It is to be understood that the organic solvent from the organic solvent supply member 620 may include de-ionized water and/or a separate de-ionized water supply member may be provided for the embodiments illustrated in FIGS. 15–18.

FIG. 17 is a perspective view illustrating further embodiments of the organic solvent supply member 620 of the apparatus of FIG. 15. As shown in FIG. 17, an organic solvent supply member 620a can have a length substantially identical to the diameter of the wafer W. The extended length of the organic solvent supply member 620a as compared to the organic solvent supply member 620 may reduce the drying time for the wafer W. It is also to be understood that different lengths of the organic solvent supply member may be provided. In addition, the organic solvent supply member 620, 620a can be configured for movement in a vertical and/or a horizontal direction to facilitate loading and unloading of the wafer W into and from the processing chamber. Additional driving apparatus may be provided to support such movement.

Figure 18:
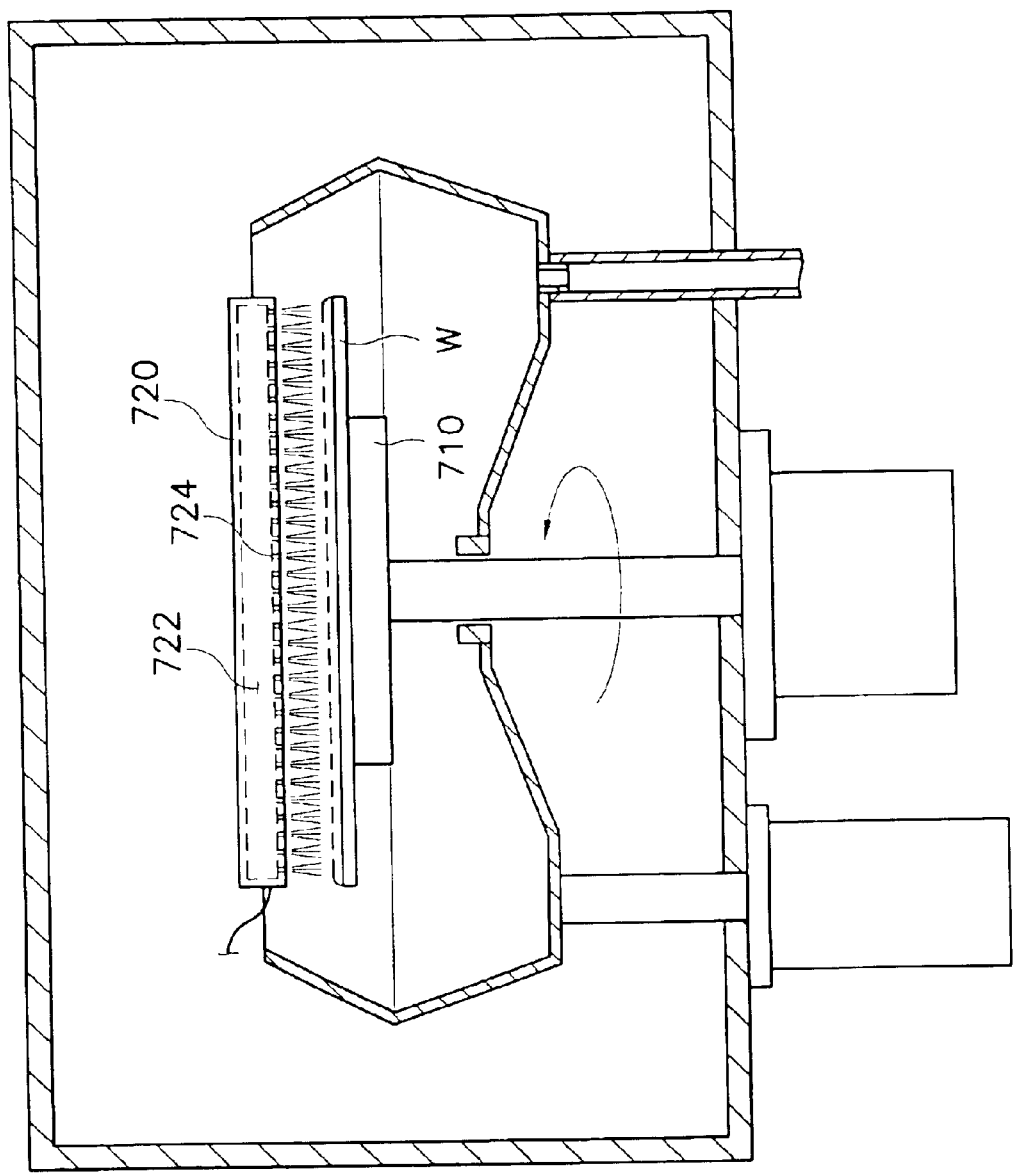
FIG. 18 is a cross-sectional side view illustrating an apparatus for drying a wafer according to sixth embodiments of the present invention.
Figure 19:
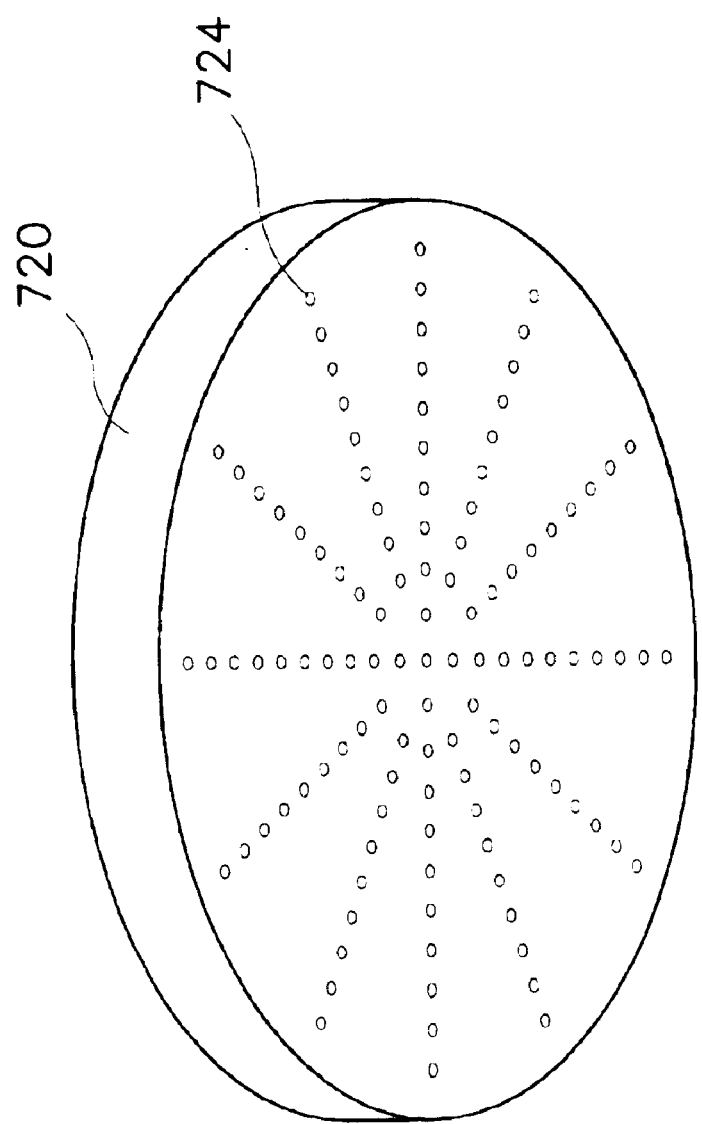
FIG. 19 is a perspective view illustrating embodiments of the organic solvent supply member of FIG. 18.

Further embodiments of the present invention will now be described with reference to FIGS. 18 and 19. FIG. 18 is a cross-sectional side view illustrating an apparatus for drying a wafer and FIG. 19 is a perspective view illustrating embodiments of the organic solvent supply member of FIG. 18. As shown in FIGS. 18 and 19, an organic solvent supply member 720 is disposed over the wafer W, which is supported by a rotating chuck 710. The organic solvent supply member 720 supplies an organic solvent onto the wafer W. The organic solvent supply member 720 is illustrated as having a disc shape with a diameter substantially corresponding to that of the wafer W to provide coverage of the wafer W. A space 722 is provided in the organic solvent supply member 720 to receive the organic solvent. A plurality of organic solvent supply nozzles 724 is formed at a lower portion of the organic solvent supply member 720 that supply the organic solvent onto the wafer W. To facilitate uniform delivery of the organic solvent onto the wafer W, the organic solvent supply nozzles 724 may be radially disposed as illustrated in FIGS. 18 and 19 although other configurations may be provided that will facilitate uniform delivery of the organic solvent to the wafer W.

The wafer W is dried due to the rotation of the wafer W while the organic solvent is supplied onto the wafer W. For the embodiments illustrated in FIGS. 18 and 19, the organic solvent may be simultaneously sprayed onto the entire surface of the wafer W and the drying time for the wafer W may be reduced while inhibiting creation of watermarks.

In accordance with some embodiments of the present invention, the de-ionized water provided from the de-ionized water supply member can inhibit or prevent natural drying of the wafer W. As a result, generation of watermarks at the edge portion of the wafer may be inhibited or prevented. Effective delivery of organic solvent onto the surface of the wafer W in accordance with various embodiments of the present invention may also inhibit formation of watermarks on the wafer W. Furthermore, as the organic solvent may be substantially uniformly supplied onto the entire surface of the wafer, the time for drying the wafer may be shortened and watermark generation may be more effectively inhibited or prevented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An apparatus for drying a wafer comprising:
   a rotary chuck configured to hold the wafer in a horizontal plane; and
   an organic solvent supply member positioned adjacent a face of the wafer, the solvent supply member having a plurality of solvent supply nozzles disposed to supply organic solvent onto the wafer in order to remove a moisture remaining on the wafer, wherein the organic solvent supply member includes a substantially disc shaped member extending over substantially the entire wafer, and the plurality of nozzles are positioned therein to substantially uniformly supply the organic solvent onto the wafer.

2. The apparatus of claim 1 wherein the organic solvent supply member further comprises a receiving chamber configured to receive the organic solvent and the nozzles of the organic solvent supply member are communicatively coupled to the receiving chamber.

3. An apparatus for drying a wafer comprising:
   a rotary chuck configured to hold the wafer in a horizontal plane; and
   an organic solvent supply member positioned adjacent a face of the wafer, the solvent supply member having a plurality of solvent supply nozzles disposed to supply organic solvent onto the wafer in order to remove a moisture remaining on the wafer, wherein the organic solvent supply member includes a longitudinally extending member extending from a central portion of the wafer to an edge portion of the wafer, the plurality of nozzles are positioned therein in radially extending positions, and the organic solvent supply member is positioned over the wafer.

4. The apparatus of claim 3 wherein the organic solvent supply member has a length of about half a diameter of the wafer.

5. The apparatus of claim 3 wherein the organic solvent supply member has a length of about a diameter of the wafer.

6. The apparatus of claim 3 wherein the organic solvent supply member comprises a pipe shaped member having a receiving chamber configured to receive the organic solvent, and the nozzles of the organic solvent supply member are communicatively coupled to the receiving chamber.

7. The apparatus of claim 3 further comprising a drying gas supply member positioned adjacent the wafer configured to supply a drying gas to the wafer.

8. An apparatus for drying a wafer comprising:
   a rotating chuck configured to rotate the wafer;
   a movable de-ionized water supply member positioned adjacent a face of the wafer, the de-ionized water supply member being configured to supply de-ionized water onto the wafer and to move radially between a position adjacent a central portion of the wafer and an edge portion of the wafer; and
   an organic solvent supply member positioned adjacent the face of the wafer, the organic solvent supply member having a plurality of solvent supply nozzles disposed to supply organic solvent onto the wafer in order to remove the de-ionized water supplied onto the wafer, wherein the organic solvent supply member includes:
      a first solvent supply member having at least one of the solvent supply nozzles positioned adjacent the wafer so as to move radially between a position adjacent the central portion of the wafer and the edge portion of the wafer; and
      a second solvent supply member having at least one of the solvent supply nozzles positioned in a fixed location adjacent the central portion.

9. The apparatus of claim 8 wherein the de-ionized water supply member and the first solvent supply member are configured to move together.

10. The apparatus of claim 8 wherein the solvent comprises an alcohol.

11. The apparatus of claim 10 wherein the first and second solvent supply members are configured to supply a vapor phase solvent.

12. The apparatus of claim 10 wherein the first and second solvent supply members are configured to supply a mist phase solvent carried by a carrier gas.

13. The apparatus of claim 8 further comprising a drying gas supply member positioned adjacent the wafer configured to supply a drying gas to the wafer.

14. The apparatus of claim 8 wherein the de-ionized water supply member comprises a longitudinally extending member extending radially from the central portion of the wafer that includes a plurality of de-ionized water supply nozzles.

15. The apparatus of claim 14 wherein the first solvent supply member comprises an arcuate shaped member including a plurality of nozzles, the arcuate shaped portion being concave with reference to a central axis of the rotary chuck.

16. The apparatus of claim 8 wherein the first solvent supply member comprises an arcuate shaped member including a plurality of nozzles, the arcuate shaped portion being concave with reference to a central axis of the rotary chuck.

17. The apparatus of claim 16 wherein the de-ionized water supply member comprises an arcuate shaped member including a plurality of nozzles, the arcuate shaped portion being concave with reference to a central axis of the rotary chuck, and the first solvent supply member is positioned between the de-ionized water supply member and the central axis of the rotary chuck.

18. The apparatus of claim 17 wherein the de-ionized water supply member comprises a first arcuate member and a second arcuate member, each including a plurality of nozzles, the second arcuate member being positioned on an opposite side of the central axis of the rotary chuck from the first arcuate member and being movable in an opposite direction from the first arcuate member.

19. The apparatus of claim 18 wherein the first solvent supply member comprises a third arcuate member and a fourth arcuate member, each including a plurality of nozzles, the fourth arcuate member being positioned on an opposite side of the central axis of the rotary chuck from the third arcuate member and being movable in an opposite direction from the third arcuate member.

20. The apparatus of claim 19 wherein the first and second arcuate members define a substantially circular member when the de-ionized water supply member is in the position adjacent the central portion of the wafer, and the third and fourth arcuate members define a substantially circular member when the first solvent supply member is in the position adjacent the central portion of the wafer.

21. The apparatus of claim 16 wherein the first solvent supply member comprises a first arcuate member and a second arcuate member, each including a plurality of nozzles, the second arcuate member being positioned on an opposite side of the central axis of the rotary chuck from the first arcuate member and being movable in an opposite direction from the first arcuate member.

22. The apparatus of claim 21 wherein the first and second arcuate members define a substantially circular member when the first solvent supply member is in the position adjacent the central portion of the wafer.

* * * * *